United States Patent [19]
Kawasaki

[11] Patent Number: 5,955,904
[45] Date of Patent: Sep. 21, 1999

[54] SEMICONDUCTOR INTEGRATED CIRCUIT WITH APPROPRIATE DATA OUTPUT TIMING AND REDUCED POWER CONSUMPTION

[75] Inventor: Kenichi Kawasaki, Kawasaki, Japan

[73] Assignee: Fujitsu Limited, Kawasaki, Japan

[21] Appl. No.: 08/931,669

[22] Filed: Sep. 17, 1997

[30] Foreign Application Priority Data

Mar. 21, 1997 [JP] Japan .................................. 9-068804

[51] Int. Cl.⁶ ...................................................... H03L 7/00
[52] U.S. Cl. ........................... 327/156; 327/299; 327/158
[58] Field of Search .................................... 327/147–150, 327/156–159, 291, 293, 299; 365/233

[56] References Cited

U.S. PATENT DOCUMENTS 5,767,712  6/1998  Takemae et al. ........................ 327/152
5,812,492  9/1998  Yamauchi et al. .................... 365/233.5
5,822,255  10/1998  Uchida ..................................... 364/233
5,835,956  11/1998  Park et al. ............................... 365/233

*Primary Examiner*—Tim Callahan
*Assistant Examiner*—Eunja Shin
*Attorney, Agent, or Firm*—Nikaido, Marmelstein, Murray & Oram LLP

[57] ABSTRACT

A semiconductor integrated circuit includes a first clock-input circuit receiving an external clock from an external source and outputting an internal clock, an output-control-clock generating circuit receiving the internal clock to generate an output-control clock, and a first data-output circuit outputting output data in synchronism with one of a rise timing and a fall timing of the output-control clock. The output-control-clock generating circuit controls a timing of the output-control clock such that the first data-output circuit outputs the output data a predetermined fraction of one clock cycle of the external clock after a clock pulse of the external clock.

14 Claims, 44 Drawing Sheets

FIG. 1 *PRIOR ART*

FIG. 4 *PRIOR ART*
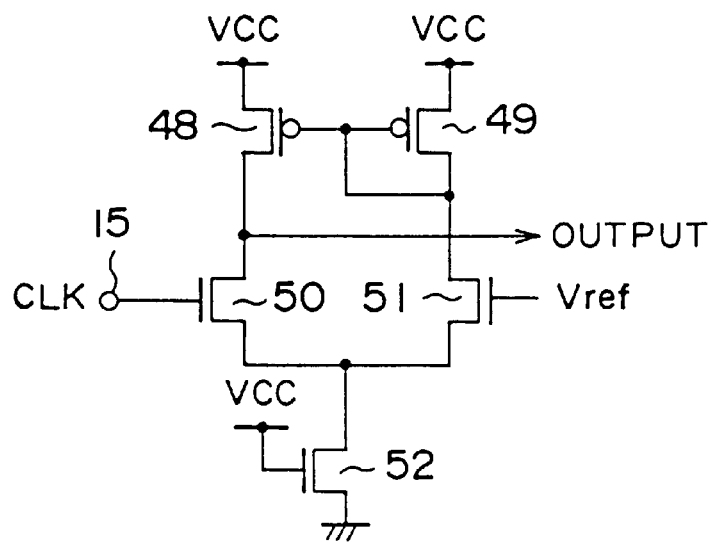
FIG. 5 *PRIOR ART*
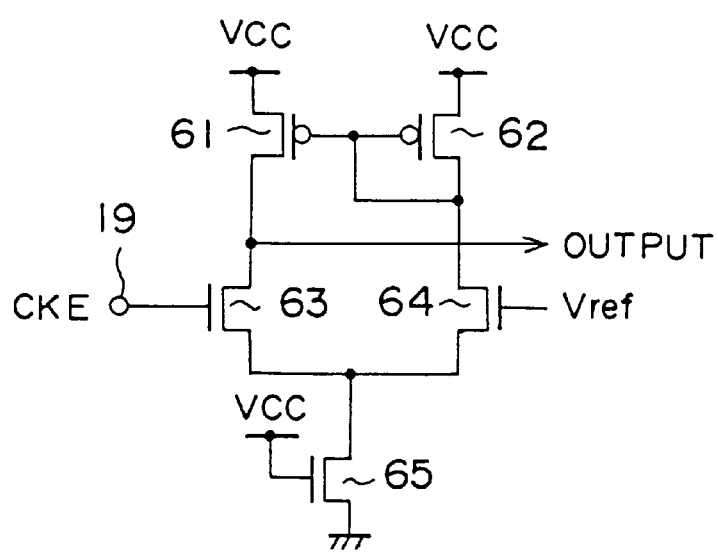

FIG.10A PRIOR ART  i-clk
FIG.10B PRIOR ART  d-clk
FIG.10C PRIOR ART  c-clk

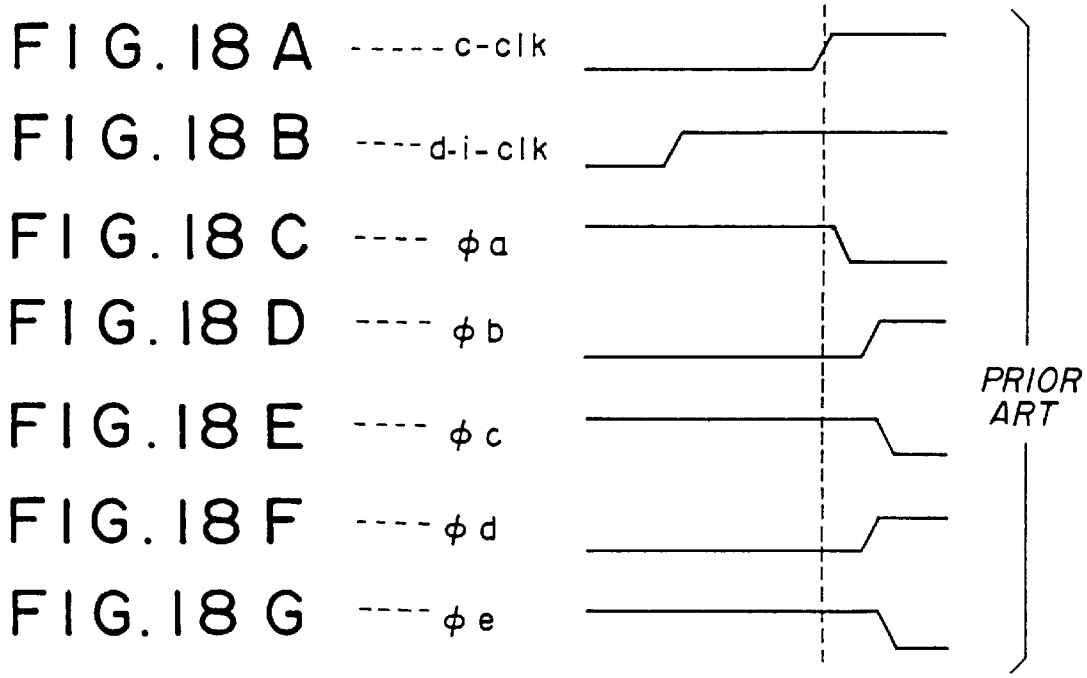
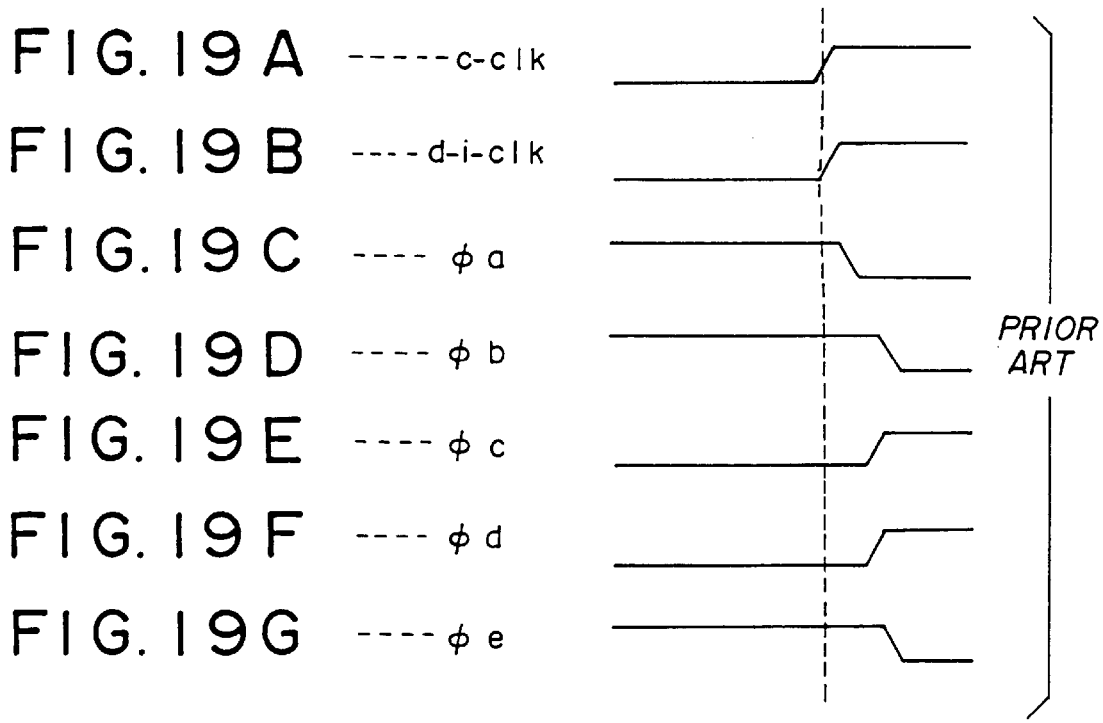

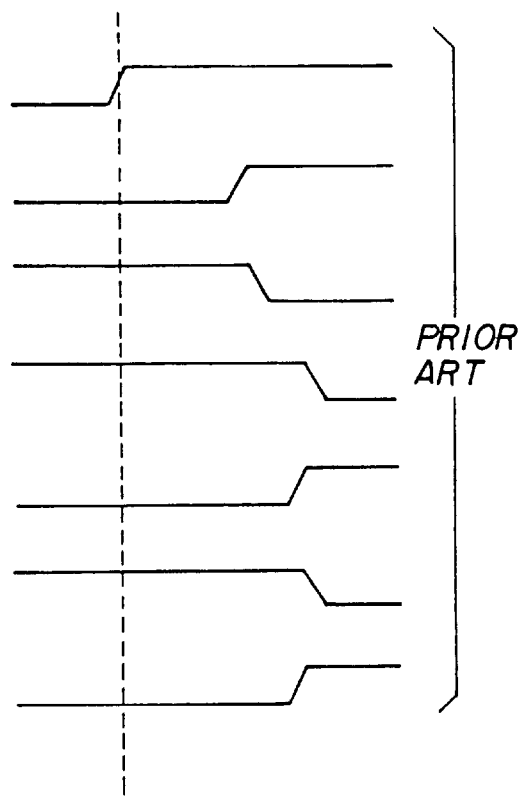
FIG.20A ----- c-clk
FIG.20B --- d-i-clk
FIG.20C ---- φa
FIG.20D ---- φb
FIG.20E ---- φc
FIG.20F ---- φd
FIG.20G ---- φe
PRIOR ART

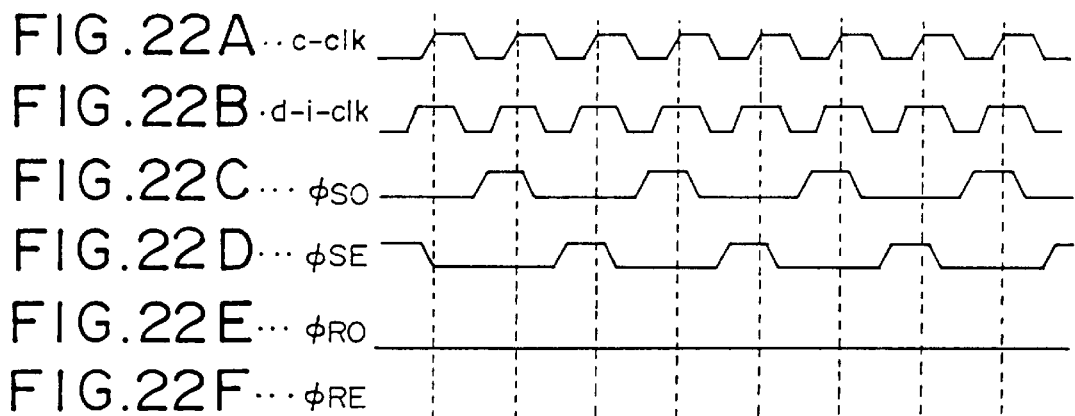
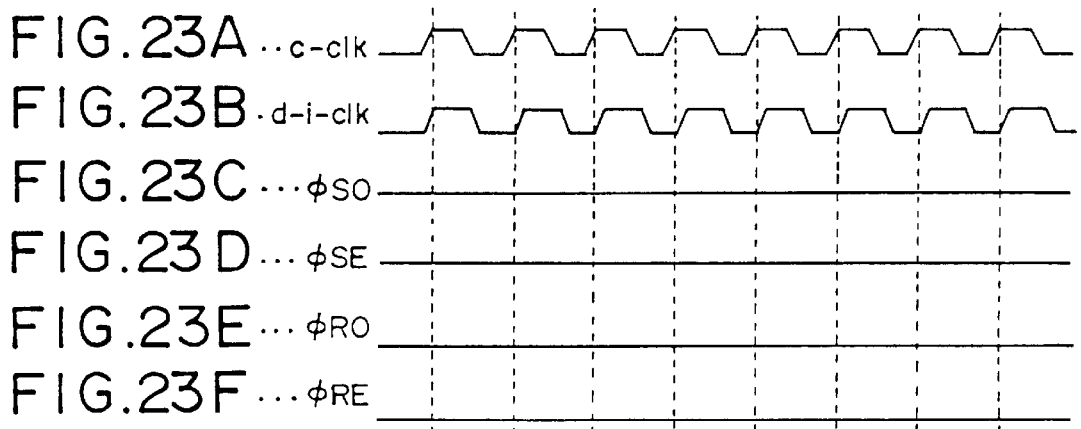
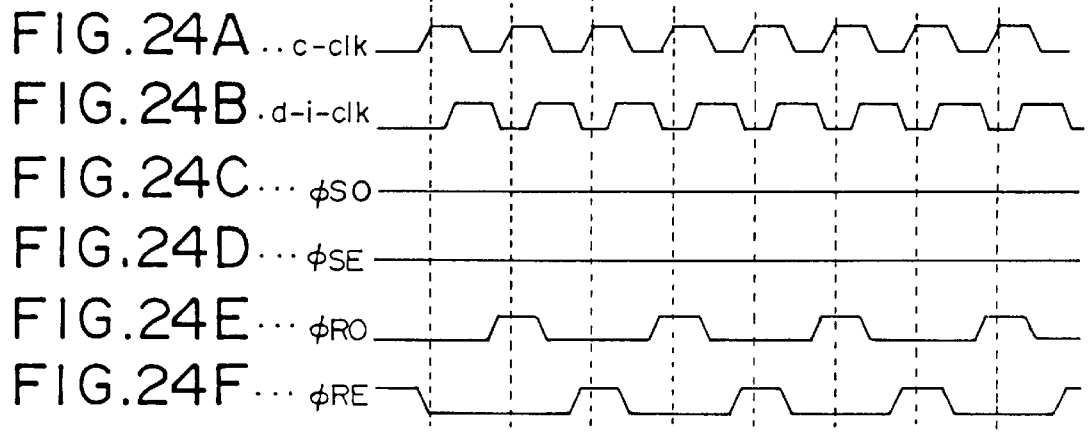

F I G. 38
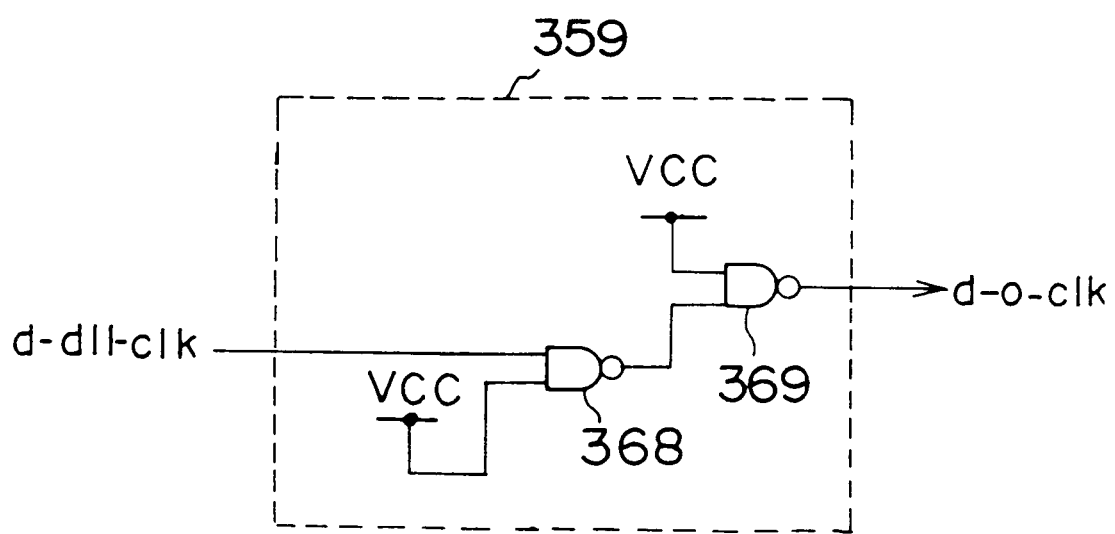

F I G. 46
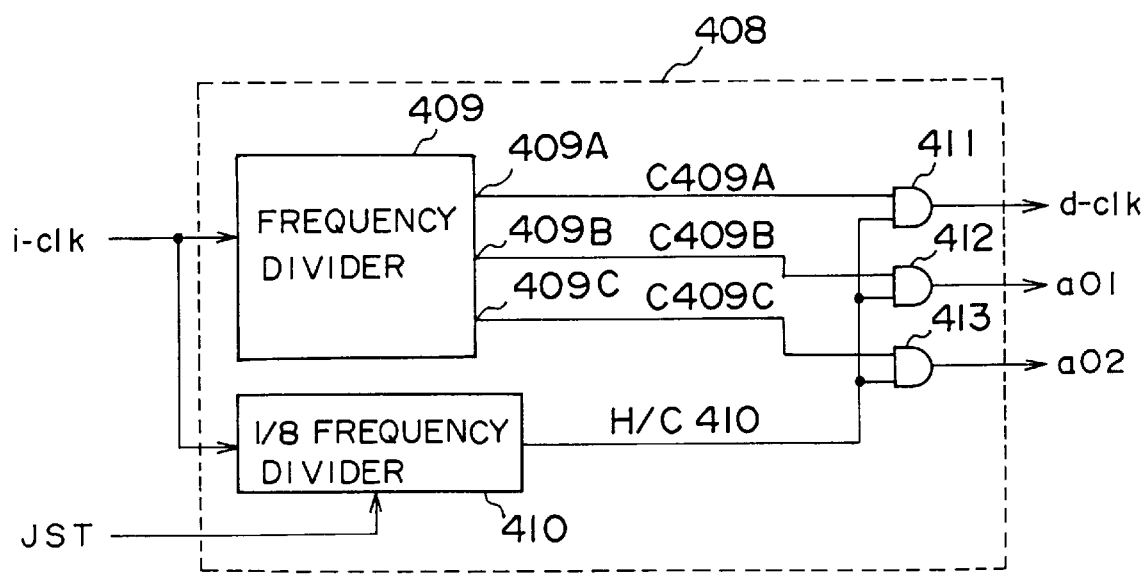

SEMICONDUCTOR INTEGRATED CIRCUIT WITH APPROPRIATE DATA OUTPUT TIMING AND REDUCED POWER CONSUMPTION

BACKGROUND OF THE INVENTION

1. Field of the Invention

The present invention relates to semiconductor integrated circuits having input/output timings which are synchronously controlled by an external clock signal provided from an external source.

2. Description of the Related Art

FIG. 1 is a block diagram showing a relevant part of an example of a synchronous-dynamic-random-access memory (which is hereinafter referred to as an SDRAM). An SDRAM is one of the semiconductor integrated circuits which has input/output timing controlled in synchronism by an external clock signal provided from an external source.

In FIG. 1, the SDRAM includes a sell-array unit 1 comprised of memory cells arranged in a matrix and address-signal-input nodes 2 (only one node is shown in the figure) for receiving address signals provided from an external source.

The SDRAM further includes a row-address buffer 3 and a row decoder 4. The row-address buffer 3 amplifies row-address signals input via the address-signal-input nodes 2, and provides complement signals representing a row address. The row decoder 4 receives the complement row-address signals from the row-address buffer 3, and decodes the signals to select a word line in the sell-array unit 1.

The SDRAM further includes a column-address buffer 5 and a column decoder 6. The column-address buffer 5 receives column-address signals from the address-signal-input nodes 2, and amplifies the signals before providing complement signals representing a column address. The column decoder 6 decodes the column-address signals from the column-address buffer 5 to produce a column-selection signal.

Further included in the SDRAM are a series of sense-amplifiers 7 and a column-selection circuit 8. The sense-amplifiers 7 amplify data read from the sell-array unit 1. The column-selection circuit 8 selects a column based on the column-selection signal provided from the column decoder 6.

Further, the SDRAM includes a data bus DB and /DB, a data-bus amplifier 9, a switch circuit 10, a data-hold circuit 11, a switch circuit 12, a data-output circuit 13, data-input/output nodes 14 (only one node is shown in the figure), a external-clock-input node 15, a clock-input circuit 16, an output-control-clock generating circuit 17, a output-control-clock signal line 18, a clock-enable-signal-input node 19, and a clock-enable-signal-input circuit 20.

The data bus DB and /DB transfers data output from the column-selection circuit 8. The data-bus amplifier 9 amplifies the data appearing on the data bus DB and /DB. The switch circuit 10 serves as a switch.

The data-hold circuit 11 holds data which are output from the data-bus amplifier 9 in a pipe-line manner. The switch circuit 12 also works as a switch. The data-output circuit 13 outputs data stored in the data-hold circuit 11 in an appropriate order. Data is input to and output from the SDRAM via the data-input/output nodes 14.

The external-clock-input node 15 receives an external clock CLK. The clock-input circuit 16 receives the external clock CLK from the external-clock-input node 15, and provides an internal clock i-clk.

The output-control-clock generating circuit 17 receives the internal clock i-clk from the clock-input circuit 16, and generates an output-control clock o-clk which is supplied to the data-output circuit 13. The output-control-clock signal line 18 conveys the output-control clock o-clk from the output-control-clock generating circuit 17 to the data-output circuit 13.

The clock-enable-signal-input node 19 receives a clock-enable signal CKE. The clock-enable-signal-input circuit 20 reads the clock-enable signal CKE via the clock-enable-signal-input node 19, and supplies a clock-suspend signal csuz to the output-control-clock generating circuit 17.

FIG. 2 is a circuit diagram of the data-output circuit 13 shown in FIG. 1. In FIG. 2, the data-output circuit 13 includes inverters 23 and 24, a transmission gate 25, a latch 28, an inverter 31, a PMOS transistor 32, a transmission gate 33, a latch 36, an inverter 39, and an NMOS transistor 40.

The inverter 23 inverts the output-control clock o-clk, and the inverter 24 inverts an output of the inverter 23.

Data DATA1 and DATA2 are a pair of data which are read from the sell-array unit 1 and provided from the data-hold circuit 11.

The transmission gate 25 controls the passage of the data DATA1, and includes PMOS transistor 26 and NMOS transistor 27 controlled by the outputs of the inverters 23 and 24, respectively, with regard to an on/off state thereof.

The latch 28 latches the data DATA1, and includes inverters 29 and 30. The inverter 31 inverts an output of the latch 28, and the PMOS transistor 32 is turned on or off depending on an output of the inverter 31. A voltage VCCQ is a power voltage for driving the data-output circuit.

The transmission gate 33 controls the passage of the data DATA2, and includes PMOS transistor 34 and NMOS transistor 35 controlled by the outputs of the inverters 23 and 24, respectively, with regard to an on/off state thereof.

The latch 36 latches the data DATA2, and includes inverters 37 and 38. The inverter 39 inverts an output of the latch 36, and the NMOS transistor 40 is turned on or off depending on an output of the inverter 39.

In the data-output circuit 13 of FIG. 2, the transmission gates 25 and 33 are turned off when the output-control clock o-clk is LOW, thereby shutting off the supply of the data DATA 1 and DATA2.

When the output-control clock o-clk turns to HIGH, the transmission gates 25 and 33 are turned on, so that the data DATA1 and DATA2 are supplied to the circuit.

If both of the data DATA1 and DATA2 are LOW, for example, the inverter 29 outputs a HIGH-level signal, so that the output of the inverter 31 is LOW to turn on the PMOS transistor 32. Further, the output of the inverter 37 is HIGH, so that the output of the inverter 39 is LOW to turn off the NMOS transistor 40. In this case, output data DQ is HIGH.

If both of the data DATA1 and DATA2 are HIGH, for example, the inverter 29 outputs a LOW-level signal, so that the output of the inverter 31 is HIGH to turn off the PMOS transistor 32. Further, the output of the inverter 37 is LOW, so that the output of the inverter 39 is HIGH to turn on the NMOS transistor 40. In this case, output data DQ is LOW.

FIG. 3 is a circuit diagram of the clock-input circuit 16 and the clock-enable-signal-input circuit 20.

The clock-input circuit 16 includes a differential amplifier 42 and inverters 43 through 46. The differential amplifier 42 receives the external clock CLK from the external-clock-input node 15.

FIG. 4 is a circuit diagram showing a configuration of the differential amplifier 42.

In FIG. 4, the differential amplifier 42 includes PMOS transistors 48 and 49 together forming a current-mirror load circuit, NMOS transistors 50 and 51 for performing a differential-amplification operation, and an NMOS transistor 52 serving as a resistance. Here, a voltage Vref is a reference voltage.

When the external clock CLK is LOW, an output of the differential amplifier 42 is HIGH, so that an output of the inverter 45 is LOW. That is, the internal clock i-clk is LOW in this case.

When the external clock CLK is HIGH, an output of the differential amplifier 42 is LOW, so that an output of the inverter 45 is HIGH. That is, the internal clock i-clk is HIGH in this case.

Accordingly, the internal clock i-clk output from the clock-input circuit 16 is the external clock CLK with a delay amounting to a total delay of the differential amplifier 42 and the inverters 43 through 45.

With reference to FIG. 3 again, the clock-enable-signal-input circuit 20 includes a differential amplifier 53, inverters 54 through 59, and a capacitor 60. The differential amplifier 53 receives the clock-enable signal CKE from the clock-enable-signal-input node 19.

FIG. 5 is a circuit diagram of the differential amplifier 53. In FIG. 5, the differential amplifier 53 includes PMOS transistors 61 and 62 together forming a current-mirror load circuit, NMOS transistors 63 and 64 for performing a differential amplification operation, and an NMOS transistor 65 serving as a resistance.

In FIG. 3, a synchronous flip-flop circuit 66 of the clock-enable-signal-input circuit 20 reads the clock-enable signal CKE in synchronism with an inverted internal clock /i-clk provided from the inverter 46 of the clock-input circuit 16. The synchronous flip-flop circuit 66 includes PMOS transistors 67 through 72, NMOS transistors 73 through 81, and inverters 82 and 83.

A latch 84 is comprised of inverters 85 and 86 having outputs thereof supplied to inputs of each other, and latches an output of the synchronous flip-flop circuit 66.

When the inverted internal clock /i-clk is LOW, the PMOS transistors 67 and 70 are turned on, and the NMOS transistor 79 is turned off.

As a result, nodes N1 and N2 are HIGH, so that the PMOS transistors 71 and 72 are turned off, and the NMOS transistors 80 and 81 are also turned off.

When the inverted internal clock /i-clk is turned to HIGH, the PMOS transistors 67 and 70 are turned off, and the NMOS transistor 79 is turned on.

Assume that the outputs of the inverters 58 and 59 are LOW and HIGH, respectively. In this case, the NMOS transistor 78 is turned on with the node N2 LOW, the PMOS transistor 68 turned on, the NMOS transistor 73 turned off, the node N1 HIGH, and the PMOS transistor 69 turned off.

As a result, the PMOS transistors 71 and 72 are turned off and on, respectively, and the NMOS transistors 80 and 81 are turned on and off, respectively. The output of the inverter 85 is thus maintained at a HIGH level.

Assume that the outputs of the inverters 58 and 59 are HIGH and LOW, respectively. In this case, the NMOS transistor 75 is turned on with the node N1 LOW, the PMOS transistor 69 is turned on, the NMOS transistor 74 is turned off, the node N2 is HIGH, and the PMOS transistor 68 is turned off.

As a result, the PMOS transistors 71 and 72 are turned on and off, respectively, and the NMOS transistors 80 and 81 are turned off and on, respectively. The output of the inverter 85 is thus maintained at a LOW level.

The clock-enable-signal-input circuit 20 further includes an inverter 87, transmission gates 88 and 89, latches 90 and 91. The latch 90 includes inverters 92 and 93, and the latch 91 includes inverters 94 and 95. In this example, an output of the inverter 94 is the clock-suspend signal csuz.

When the inverted internal clock /i-clk from the clock-input circuit 16 is HIGH (i.e., the internal clock i-clk is LOW), transmission gates 88 and 89 are turned on and off, respectively, so that the output of the inverter 85 is latched by the latch 90.

When the inverted internal clock /i-clk is changed to LOW (i.e., the internal clock i-clk is changed to HIGH), transmission gates 88 and 89 are turned off and on, respectively, so that the output of the latch 90 is latched by the latch 91.

FIG. 6 is a block diagram of the output-control-clock generating circuit 17. In FIG. 6, the output-control-clock generating circuit 17 includes a variable-delay circuit 96 for delaying the internal clock i-clk provided from the clock-input circuit 16.

FIG. 7 is a circuit diagram showing a portion of the variable-delay circuit 96, and FIG. 8 is a circuit diagram showing a remaining portion of the variable-delay circuit 96. In FIGS. 7 and 8, the variable-delay circuit 96 includes inverters 98 through 112 and NAND circuits 113 through 128. Signals TC1 through TC8 are delay controlling signals. A delayed clock dll-clk is output from the variable-delay circuit 96.

The delay controlling signals TC1 through TC8 are supplied from a delay-control circuit which will be later described, and only one of the signals is HIGH with the remaining signals being LOW.

If TC1 is HIGH with TC2 through TC8 being LOW, for example, the NAND circuit 120 serves as an inverter for an output of the inverter 101, while outputs of the NAND circuits 113 through 119 are fixed at the HIGH level.

The output of the inverter 108 is thus fixed at the HIGH level. The NAND circuit 128, then, serves as an inverter with respect to the output of the NAND circuit 120. The internal clock i-clk is transferred via the inverters 98 through 101, the NAND circuits 120 and 128, and the inverters 109 through 112, so that the delayed clock dll-clk is output from the inverter 112.

Accordingly, the delayed clock dll-clk is the internal clock i-clk delayed by a total delay of the inverters 98 through 101, the NAND circuits 120 and 128, and the inverters 109 through 112.

If TC4 is HIGH with TC1 through TC3 and TC5 through TC8 being LOW, for example, the NAND circuit 117 serves as an inverter for an output of the inverter 101, while outputs of the NAND circuits 113 through 116 and 118 through 120 are fixed at the HIGH level.

The output of the inverter 105 is thus fixed at the HIGH level. The NAND circuit 125, then, serves as an inverter with respect to the output of the NAND circuit 117. The internal clock i-clk is transferred via the inverters 98 through 101, the NAND circuits 117 and 125, the inverter 106, the NAND circuit 126, the inverter 107, the NAND circuit 127, the inverter 108, the NAND circuit 128, and the inverters 109 through 112, so that the delayed clock dll-clk is output from the inverter 112.

Accordingly, the delayed clock dll-clk is the internal clock i-clk delayed by a total delay of the inverters 98 through 101, the NAND circuits 117 and 125, the inverter 106, the NAND circuit 126, the inverter 107, the NAND circuit 127, the inverter 108, the NAND circuit 128, and the inverters 109 through 112.

With reference to FIG. 6 again, the output-control-clock generating circuit 17 further includes a clock-control circuit 129 which receives the delayed clock dll-clk from the variable-delay circuit 96 to output the output-control clock o-clk.

FIG. 9 is a circuit diagram of the clock-control circuit 129.

In FIG. 9, the clock-control circuit 129 includes an inverter 129-1 for inverting the clock-suspend signal csuz, a NAND circuit 129-2 for taking a NAND operation between the delayed clock dll-clk and an output of the inverter 129-1, and an inverter 129-3 for inverting an output of the NAND circuit 129-2 to generate the output-control clock o-clk.

In the clock-control circuit 129 of FIG. 9, the output of the inverter 129-1 is HIGH when the clock-suspend signal csuz is LOW. In this case, the NAND circuit 129-2 serves as an inverter for the delayed clock dll-clk, so that the output-control clock o-clk will be the delayed clock dll-clk delayed by the NAND circuit 129-2 and the inverter 129-3.

When the clock-suspend signal csuz is HIGH, on the other hand, the output of the inverter 129-1 is LOW, so that the output of the NAND circuit 129-2 and the output of the inverter 129-3 are fixed at the HIGH level and the LOW level, respectively.

With reference to FIG. 6 again, the output-control-clock generating circuit 17 further includes a frequency divider 130 which generates a dummy clock d-clk and a reference clock c-clk by dividing the frequency of the internal clock i-clk from the clock-input circuit 16.

FIGS. 10A through 10C are timing charts showing operations of the frequency divider 130. FIG. 10A shows the internal clock i-clk, and FIG. 10B shows the dummy clock d-clk. Further, FIG. 10C exhibits the reference clock c-clk.

The dummy clock d-clk is obtained by dividing the frequency of the internal clock i-clk by four. The reference clock c-clk is obtained by inverting the dummy clock d-clk, so that a rising edge of the reference clock c-clk is delayed by one cycle of the internal clock i-clk compared to a rising edge of the dummy clock d-clk.

With reference to FIG. 6 again, the output-control-clock generating circuit 17 further includes a delayed-synchronous-loop circuit 131 and a variable-delay circuit 132. The delayed-synchronous-loop circuit 131 may be hereinafter referred to as a DLL circuit as it becomes convenient. The variable-delay circuit 132 delays the dummy clock d-clk to generate a delayed dummy clock d-dll-clk.

FIG. 11 is a circuit diagram showing a portion of the variable-delay circuit 132, and FIG. 12 is a circuit diagram showing a remaining portion of the variable-delay circuit 132. As shown in FIGS. 11 and 12, the variable-delay circuit 132 has the same configuration as the variable-delay circuit 96, and includes inverters 134 through 148 and NAND circuits 149 through 164.

The variable-delay circuit 132 is provided to emulate the variable-delay circuit 96. Both the variable-delay circuit 132 and the variable-delay circuit 96 are controlled by the same delay-control circuit, which will be later described, so as to have the same delay time.

With reference to FIG. 6 again, the output-control-clock generating circuit 17 further includes a clock-control circuit 165 which emulates the operations of the clock-control circuit 129. FIG. 13 is a circuit diagram of the clock-control circuit 165.

In FIG. 13, the clock-control circuit 165 includes a NAND circuit 165-1 for taking a NAND operation between the delayed dummy clock d-dll-clk and the power voltage VCC, and includes an inverter 165-2 for inverting an output of the NAND circuit 165-1 to generate a dummy output-control clock d-o-clk.

With reference to FIG. 6 again, the output-control-clock generating circuit 17 further includes a signal line 166 and a data-output circuit 167. The signal line 166 emulates a signal line 166 to convey the dummy output-control clock d-o-clk output from the clock-control circuit 165. The data-output circuit 167 is a dummy circuit emulating operations of the data-output circuit 13, and receives the dummy output-control clock d-o-clk via the signal line 166 to output dummy output data d-dq.

FIG. 14 is a circuit diagram of the data-output circuit 167. In FIG. 14, an inverter 169 inverts the dummy output-control clock d-o-clk, and an inverter 170 inverts an output of the inverter 169.

A transmission gate 171 has an input thereof connected to the ground, and includes a PMOS transistor 172 and an NMOS transistor 173. The PMOS transistor 172 and the NMOS transistor 173 are turned on or off, depending on the output of the inverter 169 and the output of the inverter 170, respectively.

A latch 174 includes an inverter 175 and a NAND circuit 176 which receives the dummy output-control clock d-o-clk at one input thereof. A NAND circuit 177 receives an output of the inverter 175 at one input thereof and the power voltage VCC at the other input thereof. A PMOS transistor 178 is controlled to be turned on or off by the output of the NAND circuit 177.

A transmission gate 179 has an input thereof connected to the ground, and includes a PMOS transistor 180 and an NMOS transistor 181. The PMOS transistor 180 and the NMOS transistor 181 are turned on or off, depending on the output of the inverter 169 and the output of the inverter 170, respectively.

A latch 182 includes an inverter 183 and a NAND circuit 184 which receives the dummy output-control clock d-o-clk at one input thereof. A NOR circuit 185 receives an output of the inverter 183 at one input thereof, and the other input thereof is connected to the ground. A NMOS transistor 186 is controlled to be turned on or off by the output of the NOR circuit 185.

When the dummy output-control clock d-o-clk is LOW, the output of the inverter 169 is HIGH, and the output of the inverter 170 is LOW, so that the transmission gates 171 and 179 are turned off.

Since the output of the NAND circuit 176 is HIGH, the inverter 175 outputs a LOW-level signal. In this case, the output of the NAND circuit 177 is HIGH, so that the PMOS transistor 178 is turned off. Further, since the output of the NAND circuit 184 is HIGH, the inverter 183 outputs a LOW-level signal. In this case, the output of the NOR circuit 185 is HIGH, so that the NMOS transistor 186 is turned on. As a result, the dummy output data d-dq output from the data-output circuit 167 is LOW.

When the dummy output-control clock d-o-clk is HIGH, on the other hand, the output of the inverter 169 is LOW, and the output of the inverter 170 is HIGH, so that the transmission gates 171 and 179 are turned on.

The NAND circuit 176 in this case serves as an inverter for the output of the inverter 175, and the NAND circuit 184 also serves as an inverter for the output of the inverter 183.

Accordingly, the inverter 175 outputs a HIGH-level signal. The output of the NAND circuit 177 is LOW, so that the PMOS transistor 178 is turned on. Further, the inverter 183 outputs a HIGH-level signal. The output of the NOR circuit 185 is LOW, so that the NMOS transistor 186 is turned off. As a result, the dummy output data d-dq output from the data-output circuit 167 is HIGH.

In this manner, the dummy output data d-dq output from the data-output circuit 167 is the dummy output-control clock d-o-clk delayed by the same delay amount introduced by the data-output circuit 13.

With reference to FIG. 6 again, the output-control-clock generating circuit 17 further includes a load circuit 188 which emulates the load of the data-output circuit 167.

FIG. 15 is a circuit diagram of the load circuit 188. As shown in FIG. 15, the load circuit 188 includes a capacitor 190.

With reference to FIG. 6 again, the output-control-clock generating circuit 17 further includes a clock-input circuit 192, which is a dummy circuit receiving the dummy output data d-dq from the data-output circuit 167 to output a dummy internal clock d-i-clk. The clock-input circuit 192 has the same configuration as the clock-input circuit 16.

The output-control-clock generating circuit 17 further includes a phase comparator 193 which compares phases between the reference clock c-clk and the dummy internal clock d-i-clk.

FIG. 16 is a block diagram of the phase comparator 193. As shown in FIG. 16, the phase comparator 193 includes a phase-comparison unit 195 and a delay-control-circuit controlling unit 196.

FIG. 17 is a circuit diagram of the phase-comparison unit 195. The phase-comparison unit 195 compares the phase of the reference clock c-clk with the phase of the dummy internal clock d-i-clk to generate phase-comparison signals φa, φb, φc, φd, and φe. As shown in FIG. 17, the phase-comparison unit 195 includes NAND circuits 198 through 211, inverters 212 through 215, and a NOR circuit 216.

FIGS. 18A through 18G are timing charts showing relations between the reference clock c-clk, the dummy internal clock d-i-clk, and the phase-comparison signals φa, φb, φc, φd, and φe. FIGS. 18A through 18G show a case in which the dummy internal clock d-i-clk has a phase that is ahead of the phase of the reference clock c-clk.

FIGS. 19A through 19G are timing charts showing relations between the reference clock c-clk, the dummy internal clock d-i-clk, and the phase-comparison signals φa, φb, φc, φd, and φe, in which the dummy internal clock d-i-clk is in synchronism with the reference clock c-clk.

FIGS. 20A through 20G are timing charts showing relations between the reference clock c-clk, the dummy internal clock d-i-clk, and the phase-comparison signals φa, φb, φc, φd, and φe, in which the dummy internal clock d-i-clk has a phase that is behind the phase of the reference clock c-clk.

With reference to FIG. 16 again, the delay-control-circuit controlling unit 196 receives the phase-comparison signals φa, φb, φc, φd, and φe, and generates control signals $\phi_{SO}$, $\phi_{SE}$, $\phi_{RO}$, and $\phi_{RE}$.

FIG. 21 is a circuit diagram of the delay-control-circuit controlling unit 196.

In FIG. 21, the delay-control-circuit controlling unit 196 includes a JK-flip-flop circuit 218 which is comprised of inverters 219 through 221 and NAND circuits 222 through 229. The delay-control-circuit controlling unit 196 further includes NAND circuits 230 through 235 and inverters 236 through 249.

FIGS. 22A through 22F are timing charts showing relations between the reference clock c-clk, the dummy internal clock d-i-clk, and the control signals $\phi_{SO}$, $\phi_{SE}$, $\phi_{RO}$, and $\phi_{RE}$. FIGS. 22A through 22F show a case in which the dummy internal clock d-i-clk has a phase that is ahead of the phase of the reference clock c-clk.

FIGS. 23A through 23F are timing charts showing relations between the reference clock c-clk, the dummy internal clock d-i-clk, and the control signals $\phi_{SO}$, $\phi_{SE}$, $\phi_{RO}$, and $\phi_{RE}$, in which the dummy internal clock d-i-clk is in synchronism with the reference clock c-clk.

FIGS. 24A through 24F are timing charts showing relations between the reference clock c-clk, the dummy internal clock d-i-clk, and the control signals $\phi_{SO}$, $\phi_{SE}$, $\phi_{RO}$, and $\phi_{RE}$, in which the dummy internal clock d-i-clk has a phase that is behind the phase of the reference clock c-clk.

With reference to FIG. 6 again, a delay-control circuit 252 controls the amount of delay introduced by the variable-delay circuits 96 and 132.

FIG. 25 is a circuit diagram of a portion of the delay-control circuit 252. FIG. 26 is a circuit diagram of a remaining portion of the delay-control circuit 252.

As shown in FIGS. 25 and 26, the delay-control circuit 252 includes NMOS transistors 254 through 285, inverters 286 through 293, NAND circuits 294 through 301, and NOR circuits 302 through 309.

The delay-control circuit 252 generates the delay controlling signals TC1 through TC8, and changes these signals to increase the delay of the variable-delay circuits 96 and 132 when the control signals $\phi_{SO}$ and $\phi_{SE}$ change between HIGH and LOW in turn, as shown in FIGS. 22C and 22D. Such changes in the control signals $\phi_{SO}$ and $\phi_{SE}$ are prompted when the phase of the dummy internal clock d-i-clk is ahead of the phase of the reference clock c-clk.

When the control signals $\phi_{SO}$, $\phi_{SE}$, $\phi_{RO}$, and $\phi_{RE}$ remain at the LOW level as shown in FIGS. 23C through 23F, the delay controlling signals TC1 through TC8 maintain their current levels, keeping the delay of the variable-delay circuits 96 and 132 unchanged. This is the case in which the dummy internal clock d-i-clk is in synchronism with the reference clock c-clk.

When the control signals $\phi_{RO}$ and $\phi_{RE}$ change between HIGH and LOW in turn as shown in FIGS. 24E and 24F, the delay controlling signals TC1 through TC8 are changed to decrease the delay of the variable-delay circuit 96 and the variable-delay circuit 132. This control is made when the dummy internal clock d-i-clk has a phase that is behind the phase of the reference clock c-clk.

An SDRAM configured as described above stores row-address signals and column-address signals in the row-address buffer 3 and the column-address buffer 5, respectively, in this order in synchronism with the external clock CLK.

The row-address signals stored in the row-address buffer 3 are amplified and converted into complement signals, which are in turn decoded by the row decoder 4. Based on the decoding results, a word line is selected in the sell-array unit 1. Data stored in cells which are connected to the selected word line are read out and amplified by the sense-amplifiers 7.

The column-address signals stored in the column-address buffer 5 are amplified and turned into complement signals, which are then decoded by the column decoder 6. The decoded results are used for selecting a column by using a column-selection signal. Data of the selected column is transferred via the data bus DB and /DB to the data-bus amplifier 9, where the data is amplified.

Data output from the data-bus amplifier 9 is held by the data-hold circuit 11 after passing through the switch circuit 10. The data of the data-hold circuit 11 is transferred to the data-output circuit 13 via the switch circuit 12 at a timing controlled by CAS latency. The data-output circuit 13 sends out the output data DQ in synchronism with rising edges of the output-control clock o-clk.

The SDRAM as described above has the following problems.

1) First Problem

FIGS. 27A through 27D are timing charts for explaining a first problem which the SDRAM of FIG. 1 is faced with. FIG. 27A shows the external clock CLK, and FIG. 27B shows the internal clock i-clk. Further, FIG. 27C exhibits the output-control clock o-clk, and FIG. 27D demonstrates the output data DQ.

In the output-control-clock generating circuit 17 of FIG. 6, the dummy internal clock d-i-clk has rising edges in synchronism with the reference clock c-clk, and this synchronization is put in place by the delay-control circuit 252 controlling the delay of the variable-delay circuit 132.

The variable-delay circuit 96 is controlled such that the delay thereof is the same as the delay of the variable-delay circuit 132. Because of this, one in four consecutive rising edges of the output-control clock o-clk is in synchronism with a rising edge of the dummy output-control clock d-o-clk. Even when there is fluctuation in the power voltage VCC, therefore, the output-control clock o-clk can be supplied to the data-output circuit 13 at constant timings.

When a total delay of the clock-input circuit 16, the variable-delay circuit 96, and the data-output circuit 13 happens to be the same as one cycle of the external clock CLK as shown in FIGS. 27A through 27D, the timing at which the output data DQ appears coincides with a rising edge of the external clock CLK. In this case, a data-hold time (tOH), which is one of the AC specifications, becomes zero. This means that an appropriate target value cannot be satisfied with regard to the data-hold time.

2) Second Problem

FIGS. 28A through 28F are timing charts for explaining a second problem which the SDRAM of FIG. 1 is faced with. FIG. 28A shows the external clock CLK, and FIG. 28B exhibits the dummy clock d-clk. FIG. 28C illustrates the dummy output-control clock d-o-clk, and FIG. 28D demonstrates the dummy output data d-dq. Further, FIG. 28E shows the dummy internal clock d-i-clk, and FIG. 28F displays the reference clock c-clk.

The SDRAM of FIG. 1 suffers from an inconvenience that the delayed-synchronous-loop circuit 131 (FIG. 6) cannot lock in synchronization when an operation frequency is increased. This situation is shown in FIGS. 28A through 28F. As shown in figures, when the operation frequency is high, a timing difference in rising edges between the dummy clock d-clk and the dummy internal clock d-i-clk may become longer than the clock cycle tCLK of the external clock CLK. When this happens, a rising edge of the dummy internal clock d-i-clk comes behind a rising edge of the reference clock c-clk, thereby causing the delayed-synchronous-loop circuit 131 to fail to lock in synchronization.

3) Third Problem

The SDRAM of FIG. 1 is designed to reduce power consumption in the delayed-synchronous-loop circuit 131 (FIG. 6) by using the dummy clock d-clk which is obtained through frequency division of the internal clock i-clk.

The lower the frequency of the dummy clock d-clk, the less power the delayed-synchronous-loop circuit 131 consumes. In order to assure a high-operation speed, however, the dummy clock d-clk cannot have too low a frequency.

In the SDRAM of FIG. 1, the frequency of the dummy clock d-clk is constant even when the delayed-synchronous-loop circuit 131 succeeds in locking in synchronization. This means that even after the successful locking, the delayed-synchronous-loop circuit 131 continues to consume power wastefully.

4) Fourth Problem

FIGS. 29A through 29D are timing charts for explaining a fourth problem which the SDRAM of FIG. 1 is faced with. FIG. 29A shows the external clock CLK having a long cycle, and FIG. 29B demonstrates the internal clock i-clk. Further, FIG. 29C exhibits the output-control clock o-clk, and FIG. 29D illustrates the output data DQ.

As shown in the figures, the SDRAM of FIG. 1 cannot assure that access can be made by the external clock CLK when the frequency of the external clock CLK becomes too low. This is because the length of delay becomes insufficient even when a maximum delay by the variable-delay circuit 96 is used. As shown in the figures, the output data DQ appears ahead of the timing of a rising edge of the external clock CLK, which means that access has failed.

5) Fifth Problem

FIGS. 30A through 30F are timing charts for explaining a second problem which the SDRAM of FIG. 1 is faced with. FIG. 30A shows the external clock CLK, and FIG. 30B exhibits the clock-enable signal CKE. FIG. 30C illustrates the output-control clock o-clk obtained from the catalogue, and FIG. 30D demonstrates the internal clock i-clk. Further, FIG. 30E shows the output-control clock o-clk actually used during operations, and FIG. 30F displays the clock-suspend signal csuz.

As shown in the figures, the SDRAM of 1 changes the clock-suspend signal csuz to HIGH when the clock-enable signal CKE is latched, but this change is not initiated until the internal clock i-clk is generated. This results in an excessive power consumption in the variable-delay circuit 96.

Accordingly, there is a need for a semiconductor integrated circuit which can achieve an appropriate target value for the data-hold time.

Further, there is a need for a semiconductor integrated circuit which allows access to be made by a clock signal even when a frequency of the clock signal is low.

Moreover, there is a need for a semiconductor integrated circuit which can reduce power consumption.

SUMMARY OF THE INVENTION

Accordingly, it is a general object of the present invention to provide a semiconductor integrated circuit which can satisfy the needs described above.

It is another and more specific object of the present invention to provide a semiconductor integrated circuit which can achieve an appropriate target value for the data-hold time.

It is yet another object of the present invention to provide a semiconductor integrated circuit which allows access to be made by a clock signal even when a frequency of the clock signal is low.

It is still another object of the present invention to provide a semiconductor integrated circuit which can reduce power consumption.

In order to achieve the above objects, a semiconductor integrated circuit according to the present invention includes a first clock-input circuit receiving an external clock from an external source and outputting an internal clock, an output-control-clock generating circuit receiving the internal clock to generate an output-control clock, and a first data-output circuit outputting output data in synchronism with one of a rise timing and a fall timing of the output-control clock. The output-control-clock generating circuit controls a timing of the output-control clock such that the first data-output circuit outputs the output data a predetermined fraction of one clock cycle of the external clock after a clock pulse of the external clock.

In the semiconductor integrated circuit described above, the output-control-clock generating circuit controls a timing of the output-control clock to ensure that the output data is sent out a predetermined fraction of one clock cycle after a clock pulse of the external clock, so that the data-hold time (tOH) of this predetermined fraction of one clock cycle is assured even when there is a fluctuation in a power voltage or the like. Reliable data-read operations are thus achieved.

According to one aspect of the present invention, the output-control-clock generating circuit includes a variable-delay circuit for delaying the internal clock to generate the output-control clock. However, when a frequency of the external clock is so low that the variable-delay circuit cannot provide a sufficient delay, the output-control-clock generating circuit outputs the internal clock as the output-control clock by bypassing the variable-delay circuit. The semiconductor integrated circuit thus allows access to be made by the external clock even when a frequency of the clock signal is low.

According to another aspect of the present invention, the output-control-clock generating circuit, which uses a frequency-divided clock for operations thereof, lowers a frequency of the frequency-divided clock when the adjustment of the timing of the output-clock signal is completed. This achieves a reduction in the power consumption of the semiconductor integrated circuit.

According to another aspect of the present invention, the output-control-clock generating circuit includes a first variable-delay circuit delaying the internal clock to output the output-control clock, a first frequency divider dividing a frequency of the internal clock to generate a dummy clock and a reference clock, and a DLL circuit controlling the first variable-delay circuit based on the dummy clock and the reference clock to delay the internal clock such that the first data-output circuit outputs the output data the predetermined fraction of the one clock cycle after a clock pulse of the external clock. Further, a phase difference between the dummy clock and the reference clock is set to be sufficiently larger than the one clock cycle of the external clock. Because of this, the DLL circuit can lock in synchronization even when the frequency of the external clock is high.

According to another aspect of the present invention, the semiconductor integrated circuit further includes a clock-enable-signal-input circuit receiving a clock-enable signal from an external source, and the clock-enable-signal-input circuit supplies a clock-suspend signal to the first clock-input circuit to stop the first clock-input circuit from outputting the internal clock when the clock-enable signal is active, wherein the first clock-enable-signal-input circuit operates asynchronously in supplying the clock-suspend signal to the first clock-input circuit. This configuration achieves an immediate suspension of the internal clock when the clock-enable signal is active, thereby reducing a power consumption in the semiconductor integrated circuit.

Other objects and further features of the present invention will be apparent from the following detailed description when read in conjunction with the accompanying drawings.

BRIEF DESCRIPTION OF THE DRAWINGS

FIG. 4 is a circuit diagram showing a configuration of a differential amplifier;

FIG. 5 is a circuit diagram of a differential amplifier;

FIGS. 18A through 18G are timing charts showing relations between a reference clock, a dummy internal clock, and a phase-comparison signals;

FIGS. 19A through 19G are timing charts showing relations between the reference clock, the dummy internal clock, and the phase-comparison signals, in which the dummy internal clock is in synchronism with the reference clock;

FIGS. 20A through 20G are timing charts showing relations between the reference clock, the dummy internal clock, and the phase-comparison signals, in which the dummy internal clock has a phase that is behind a phase of the reference clock;

FIGS. 22A through 22F are timing charts showing relations between the reference clock, the dummy internal clock, and control signals;

FIGS. 23A through 23F are timing charts showing relations between the reference clock, the dummy internal clock, and the control signals, in which the dummy internal clock is in synchronism with the reference clock;

FIGS. 24A through 24F are timing charts showing relations between the reference clock, the dummy internal clock, and the control signals, in which the dummy internal clock has a phase that is behind a phase of the reference clock;

FIGS. 27A through 27D are timing charts for explaining a first problem which the SDRAM of FIG. 1 is faced with;

FIGS. 28A through 28F are timing charts for explaining a second problem which the SDRAM of FIG. 1 is faced with;

FIGS. 29A through 29D are timing charts for explaining a fourth problem which the SDRAM of FIG. 1 is faced with;

FIGS. 30A through 30F are timing charts for explaining a second problem which the SDRAM of FIG. 1 is faced with;

FIG. 38 is a circuit diagram of a clock-control circuit;

FIG. 46 is a circuit diagram of a frequency divider;

DESCRIPTION OF THE PREFERRED EMBODIMENTS

In the following, embodiments of the present invention will be described with reference to the accompanying drawings. The following description is provided by using an SDRAM as an example.

Figure 31:
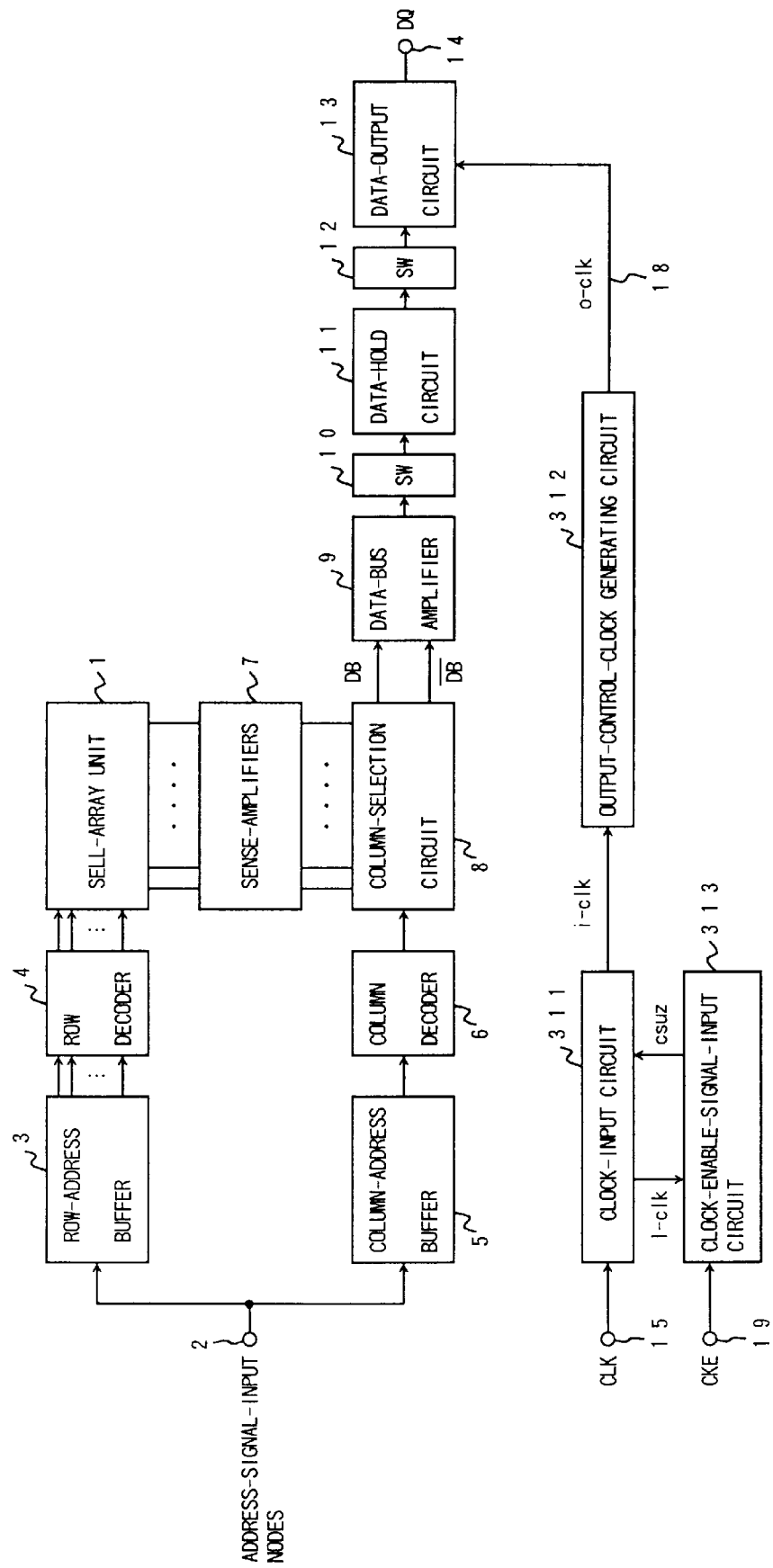
FIG. 31 is a block diagram showing a relevant part of a first embodiment of an SDRAM according to the present invention.

FIG. 31 is a block diagram showing a relevant part of a first embodiment of an SDRAM according to the present invention. In FIG. 31, the same elements as those of FIG. 1 are referred to by the same numerals, and a description thereof will be omitted.

Figure 1:
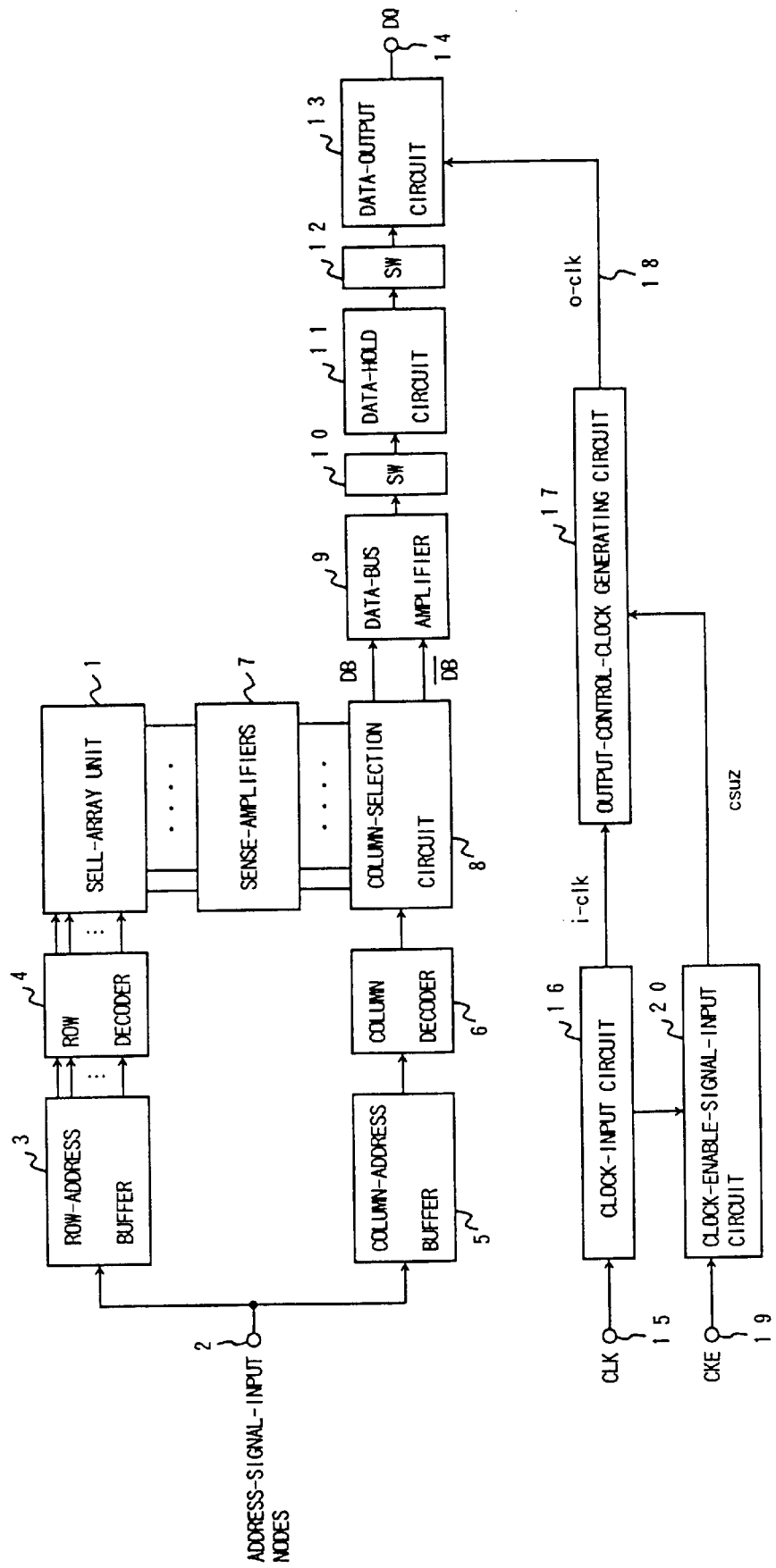
FIG. 1 is a block diagram showing a relevant part of an example of a synchronous-dynamic-random-access memory.
Figure 2:
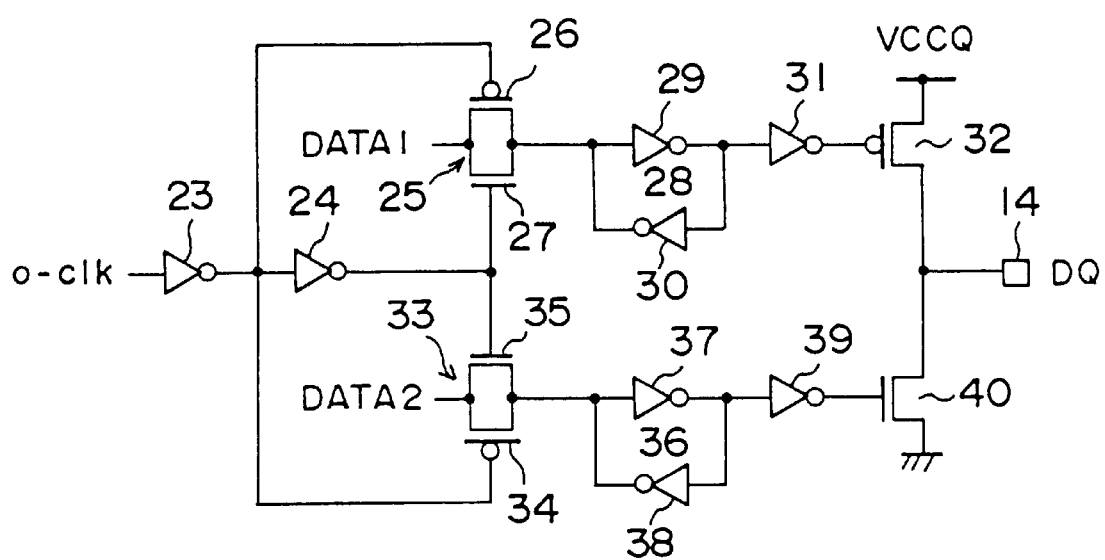
FIG. 2 is a circuit diagram of a data-output circuit shown in FIG. 1.
Figure 3:
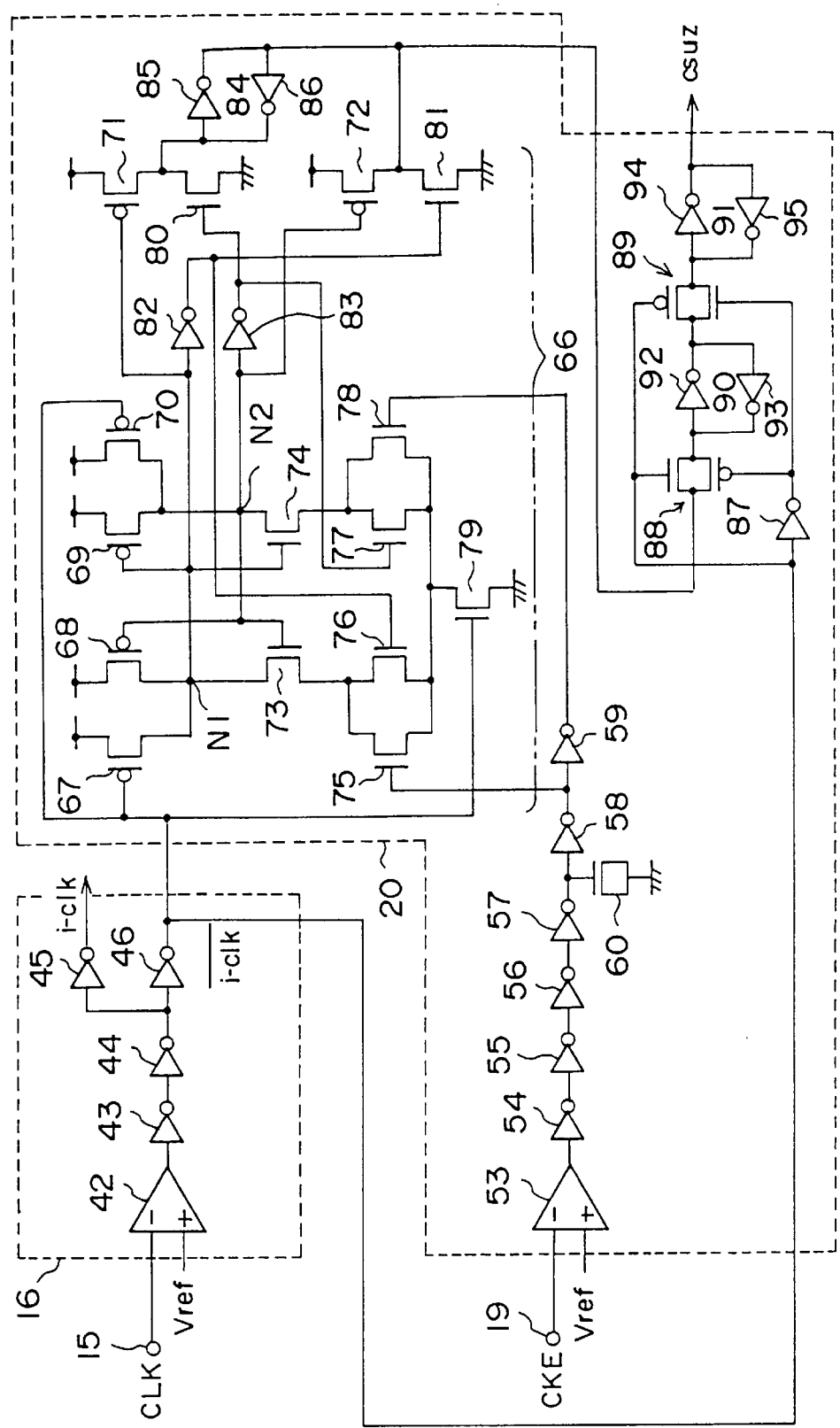
FIG. 3 is a circuit diagram of a clock-input circuit and a clock-enable-signal-input circuit.

The SDRAM of FIG. 31 differs from the SDRAM of FIG. 1 only in that the clock-input circuit 16, the output-control-clock generating circuit 17, and the clock-enable-signal-input circuit 20 are replaced by a clock-input circuit 311, an output-control-clock generating circuit 312, and a clock-enable-signal-input circuit 313, respectively.

Figure 32:
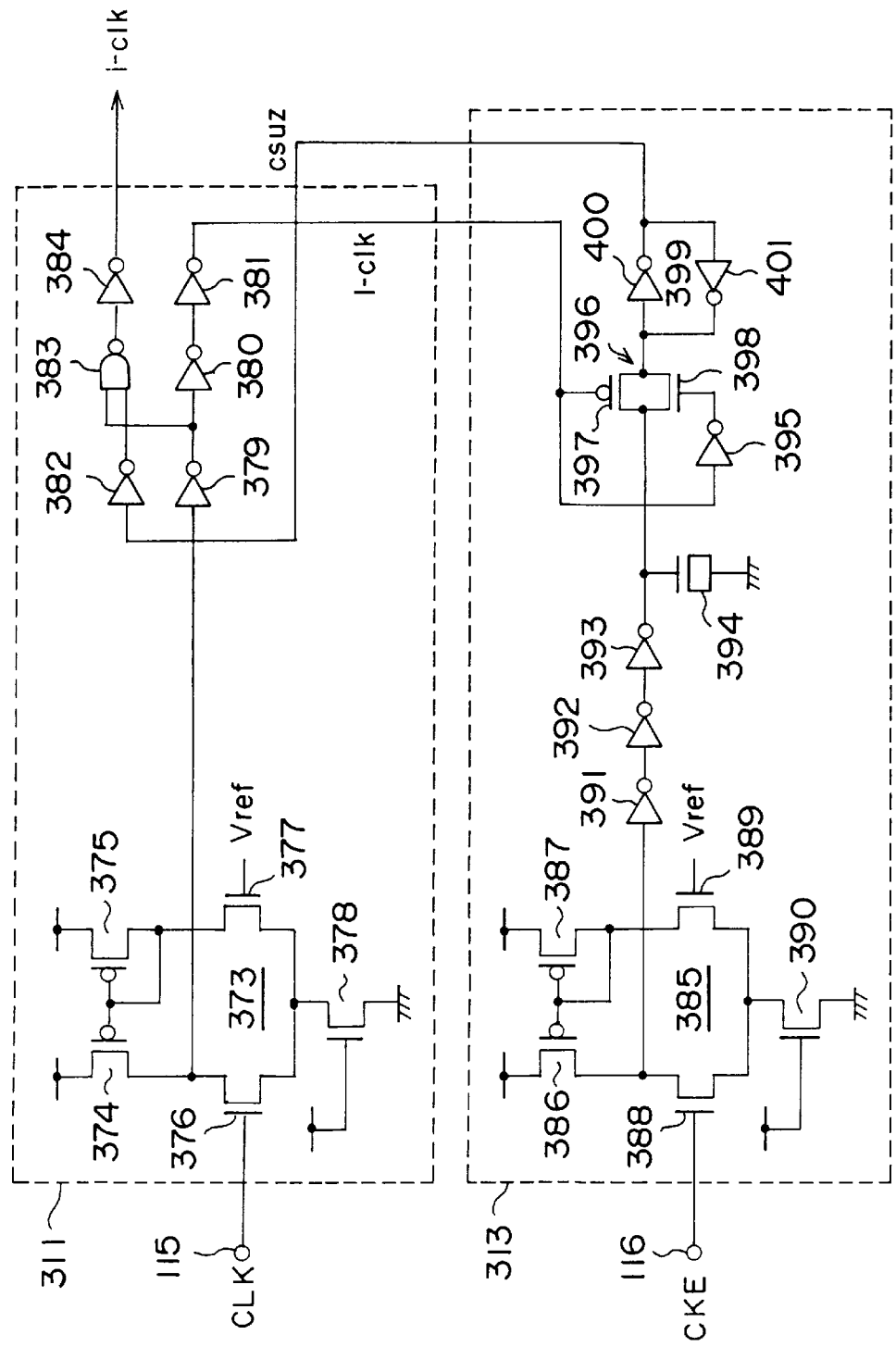
FIG. 32 is a circuit diagram of a clock-input circuit and a clock-enable-signal-input circuit.

FIG. 32 is a circuit diagram of the clock-input circuit 311 and the clock-enable-signal-input circuit 313.

In the clock-input circuit 311 of FIG. 32, a differential amplifier 373 includes PMOS transistors 374 and 375 together forming a current-mirror-load circuit, NMOS transistors 376 and 377 for achieving a differential amplification operation, and an NMOS transistor 378 serving as a resistance. Here, the voltage Vref is a reference voltage.

An inverter 379 inverts an output of the differential amplifier 373, and an inverter 380 inverts an output of the inverter 379. An output of the inverter 380 is inverted by an inverter 381, which then outputs a latch clock l-clk.

An inverter 382 inverts the clock-suspend signal csuz, and a NAND circuit 383 takes a NAND operation between an output of the inverter 379 and an output of an inverter 382. An output of the NAND circuit 383 is inverted by an inverter 384, which then outputs internal clock i-clk.

In the clock-enable-signal-input circuit 313 of FIG. 32, a differential amplifier 385 includes PMOS transistors 386 and 387 together forming a current-mirror-load circuit, NMOS transistors 388 and 389 for achieving a differential amplification operation, and an NMOS transistor 390 serving as a resistance. Here, the voltage Vref is a reference voltage.

An inverter 391 inverts an output of the differential amplifier 385, and an inverter 392 inverts an output of the inverter 391. An output of the inverter 392 is inverted by an inverter 393, with a capacitor 394 attached to an output of the inverter 393.

An inverter 395 inverts the latch clock l-clk. A transmission gate 396 includes a PMOS transistor 397 and an NMOS transistor 398. The PMOS transistor 397 and the NMOS transistor 398 are turned on or off, depending on the latch clock l-clk and the output of the inverter 395, respectively.

A latch 399 latches an output of the inverter 393, and includes inverters 400 and 401 which have outputs thereof connected to an input of each other. The output of the inverter 400 is the clock-suspend signal csuz.

The clock-suspend signal csuz is LOW when the clock-enable signal CKE is HIGH, as will be described later. With the clock-enable signal CKE being LOW, the clock-suspend signal csuz is HIGH.

When the clock-suspend signal csuz is LOW, the output of the inverter 382 is HIGH, so that the NAND circuit 383 serves as an inverter with respect to the output of the inverter 379.

In this case, the external clock CLK is delayed by the differential amplifier 373, the inverter 379, the NAND circuit 383, and the inverter 384 to be output as the internal clock i-clk from the clock-input circuit 311.

When the clock-suspend signal csuz is HIGH, on the other hand, the output of the inverter 382 is LOW, so that the outputs of the NAND circuit 383 and the inverter 384 are HIGH and LOW, respectively, at all times. No internal clock i-clk is output in this case.

Figure 33:
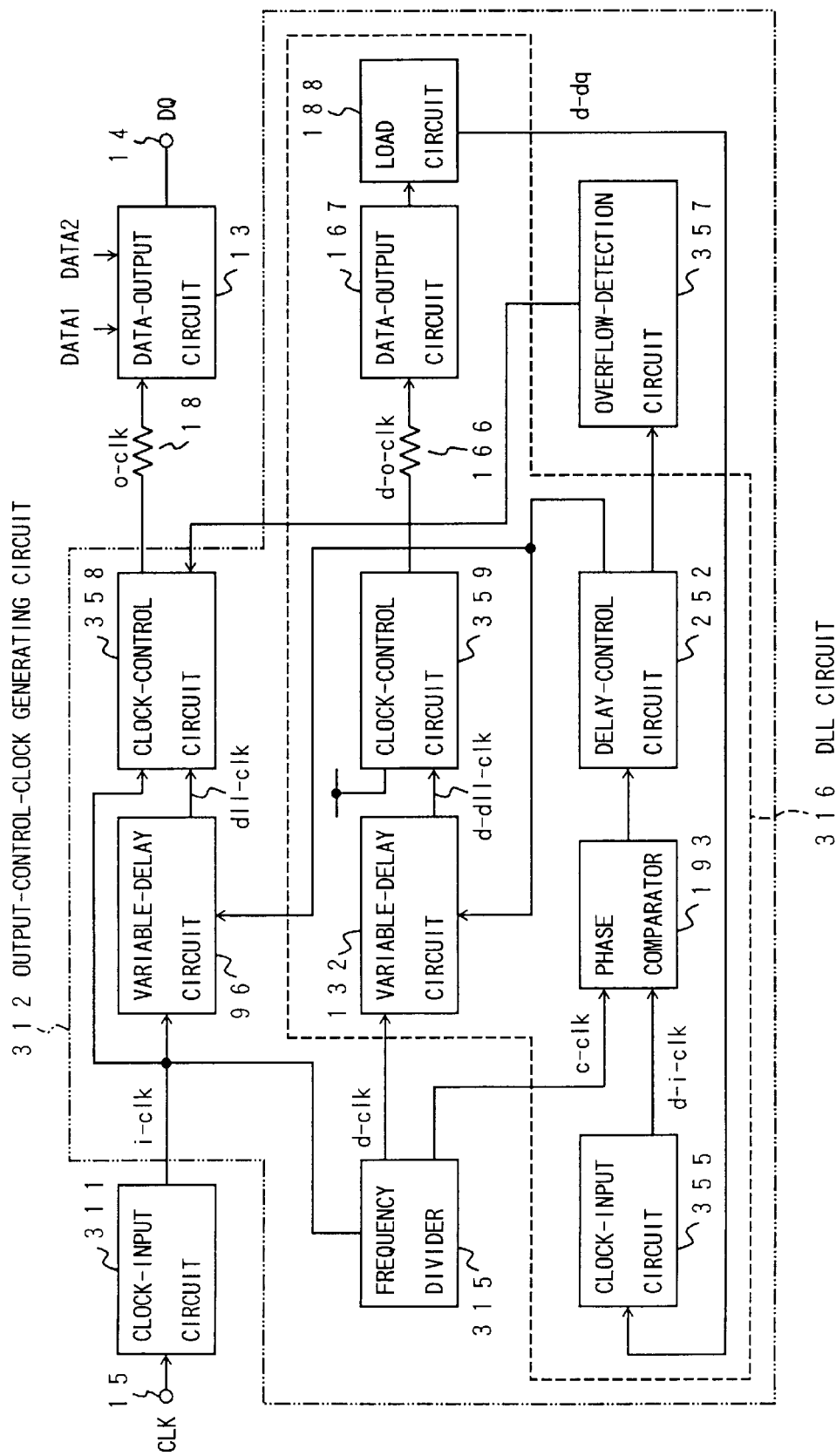
FIG. 33 is a circuit diagram of an output-control-clock generating circuit.

FIG. 33 is a circuit diagram of the output-control-clock generating circuit 312. The output-control-clock generating circuit 312 of FIG. 33 differs from the output-control-clock generating circuit 17 of FIG. 6 in that the clock-control circuit 129, the frequency divider 130, and the delayed-synchronous-loop circuit (DLL circuit) 131 are replaced by a clock-control circuit 358, a frequency divider 315, and a DLL circuit 316, respectively. Further, an overflow-detection circuit 357 is provided in order to detect overflow of the delay-control circuit 252.

Figure 34:
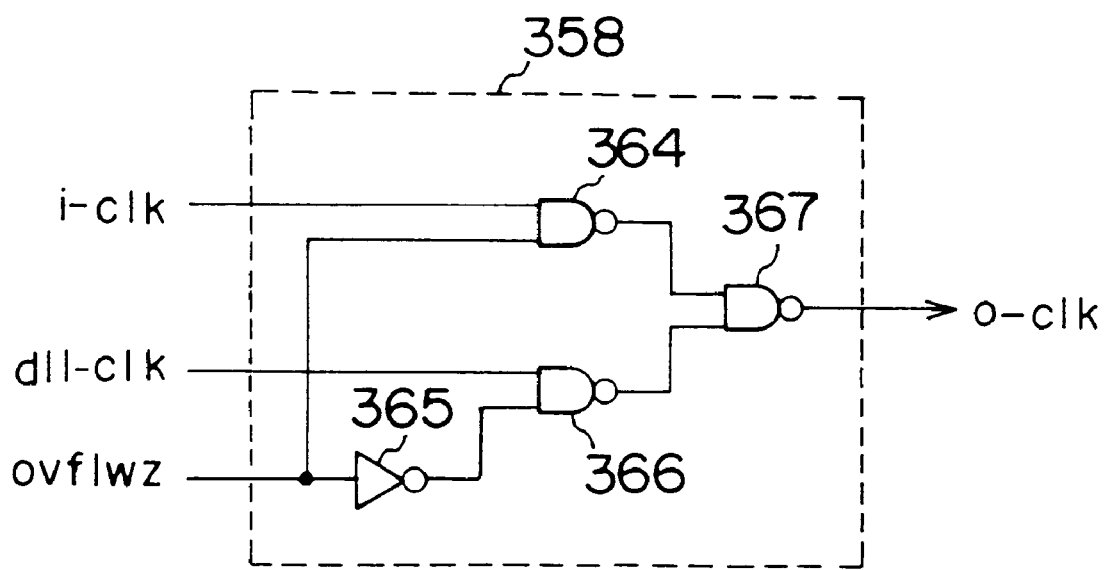
FIG. 34 is a circuit diagram of a clock-control circuit.

FIG. 34 is a circuit diagram of the clock-control circuit 358. In FIG. 34, the clock-control circuit 358 includes a NAND circuit 364, an inverter 365, and NAND circuits 366 and 367. The NAND circuit 364 takes a NAND operation between the internal clock i-clk and an overflow-detection signal ovflwz, which will be described later. The inverter 365 inverts the overflow-detection signal ovflwz.

The NAND circuit 366 takes a NAND operation between the delayed clock dll-clk provided from the variable-delay circuit 96 and an output of the inverter 365. The NAND circuit 367 takes a NAND operation between an output of the NAND circuit 364 and an output of the NAND circuit 366 to produce the output-control clock o-clk.

Figure 35:
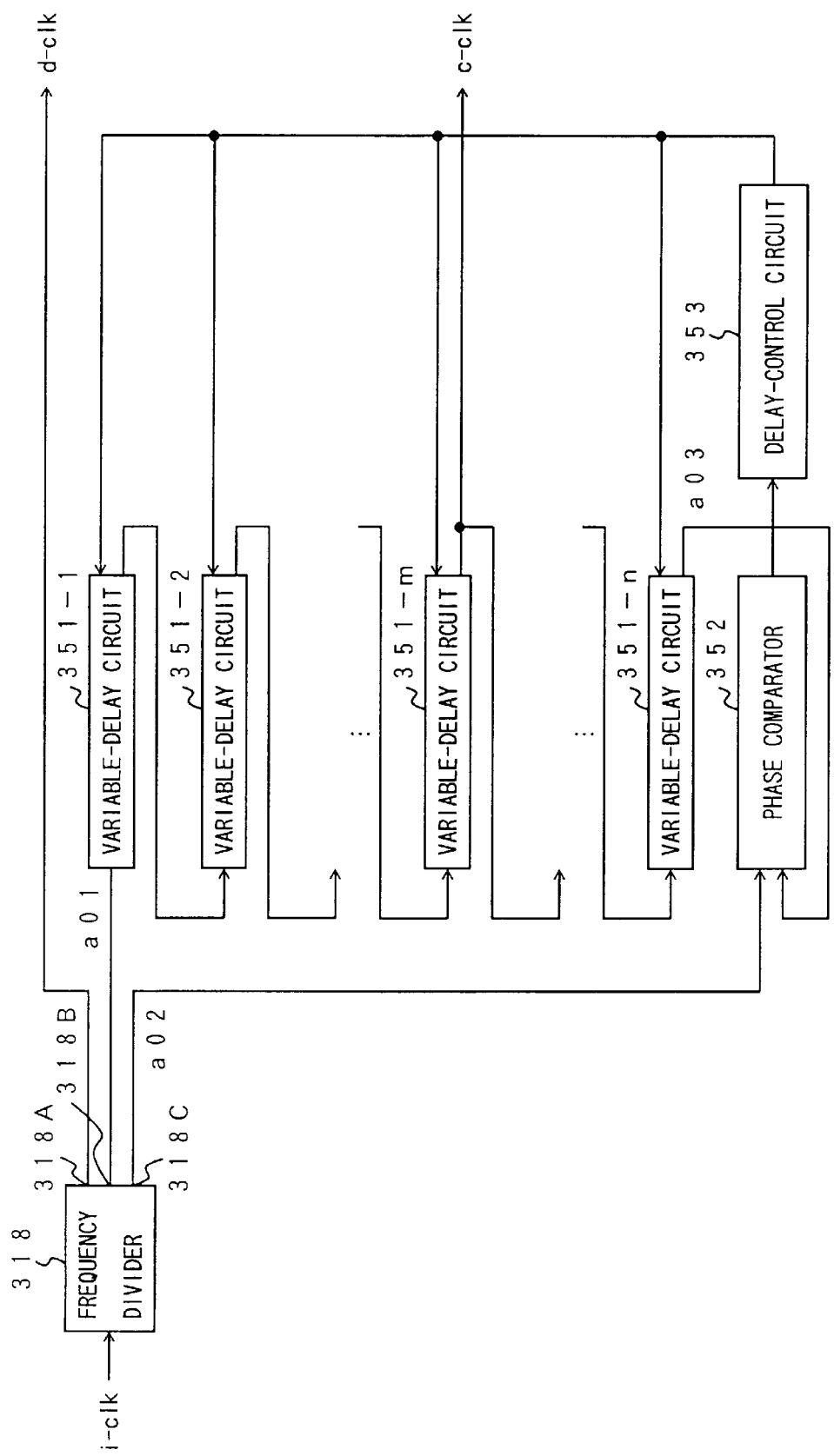
FIG. 35 is a block diagram of a frequency divider.

FIG. 35 is a block diagram of the frequency divider 315. In FIG. 35, a frequency divider 318 receives the internal clock i-clk from the clock-input circuit 311, and produces the dummy clock d-clk, a frequency-divided clock a01, and a frequency-divided clock a02.

Figure 36:
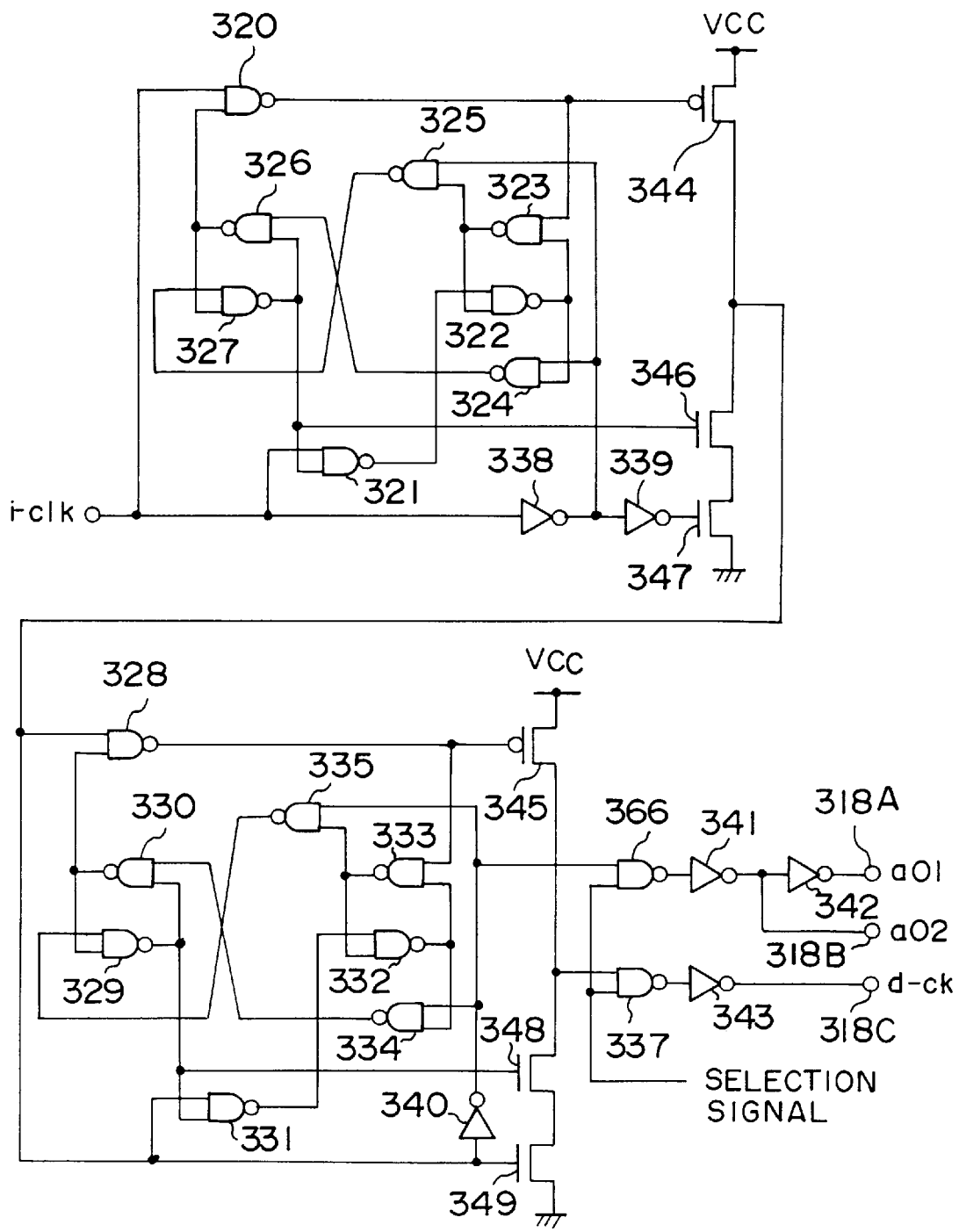
FIG. 36 is a circuit diagram of the frequency divider.

FIG. 36 is a circuit diagram of the frequency divider 318. The frequency divider 318 includes NAND circuits 320 through 337, inverters 338 through 343, PMOS transistors 344 and 345, NMOS transistors 346 through 349.

Figure 6:
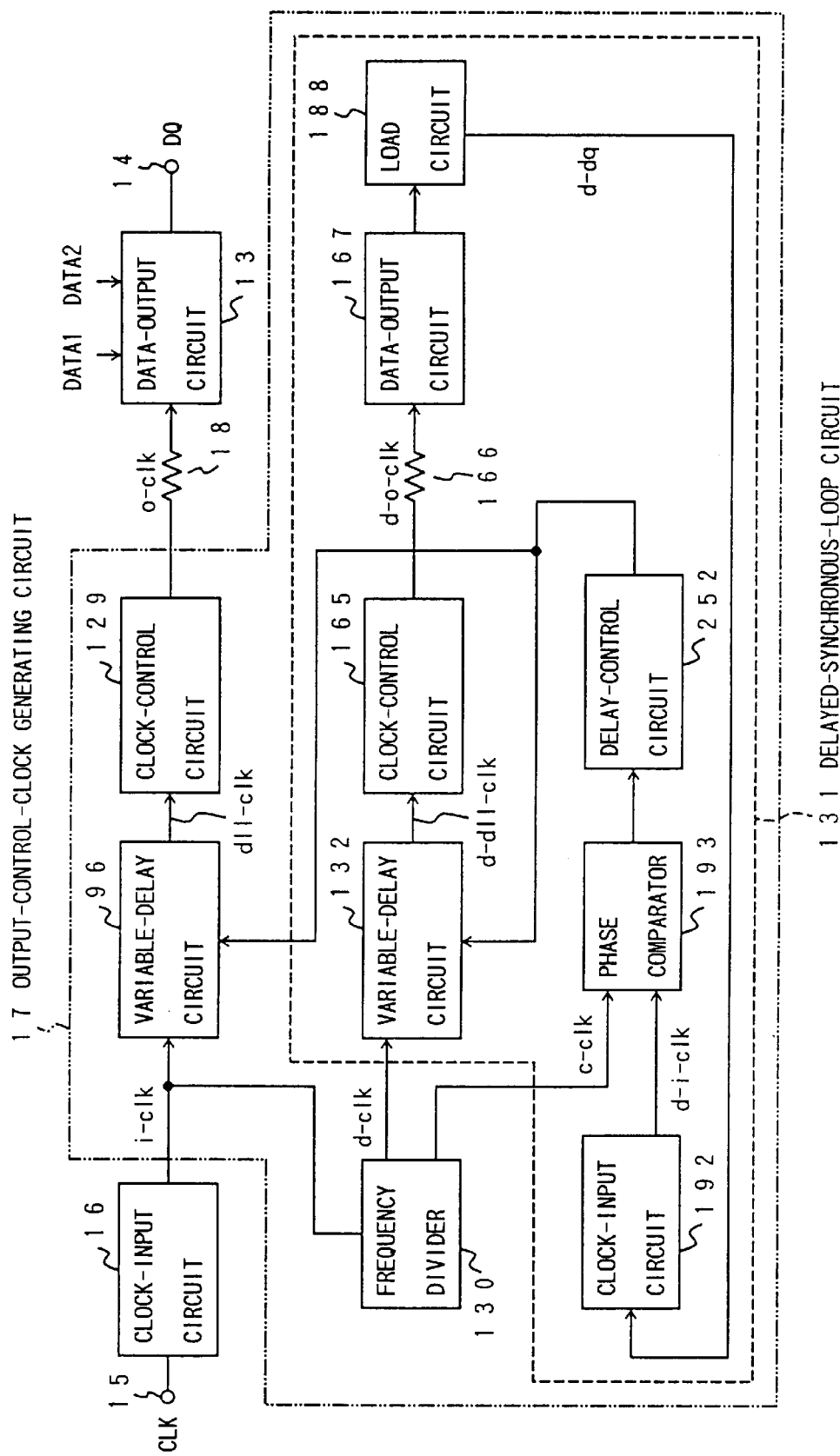
FIG. 6 is a block diagram of an output-control-clock generating circuit.
Figure 7:
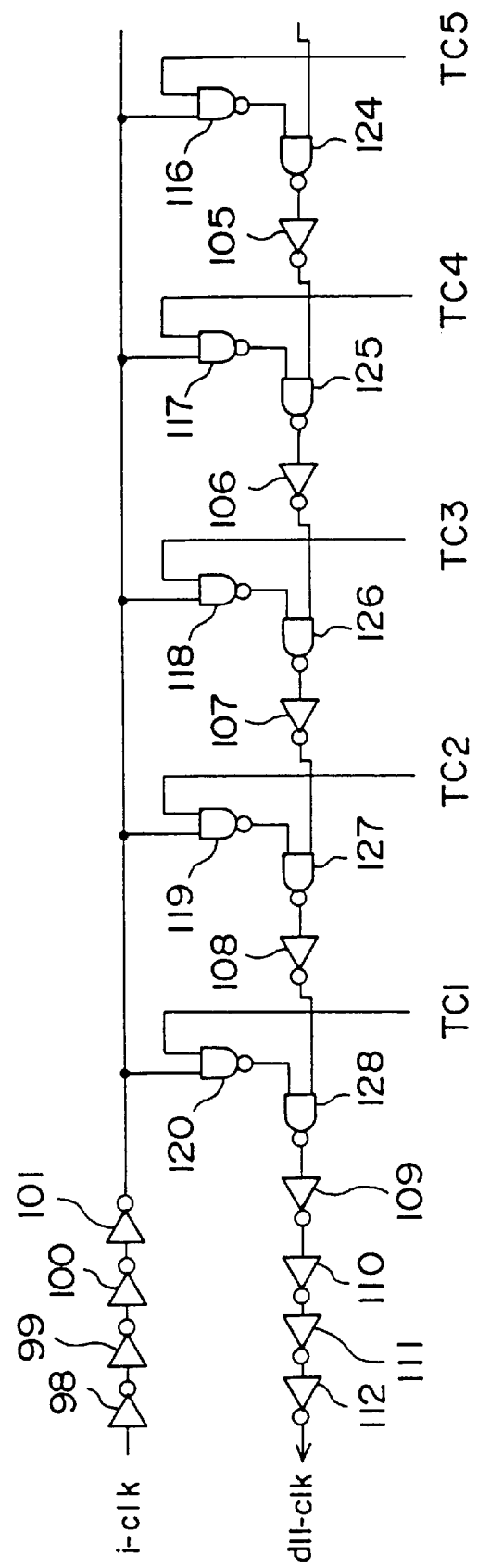
FIG. 7 is a circuit diagram showing a portion of a variable-delay circuit.
Figure 8:
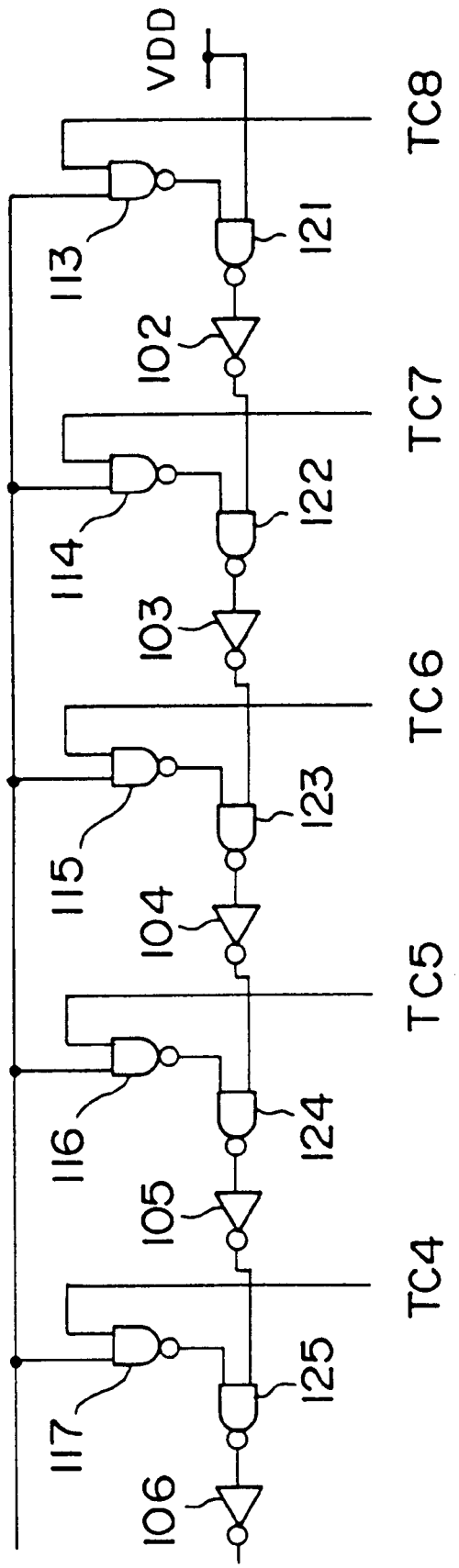
FIG. 8 is a circuit diagram showing a remaining portion of the variable-delay circuit.
Figure 9:
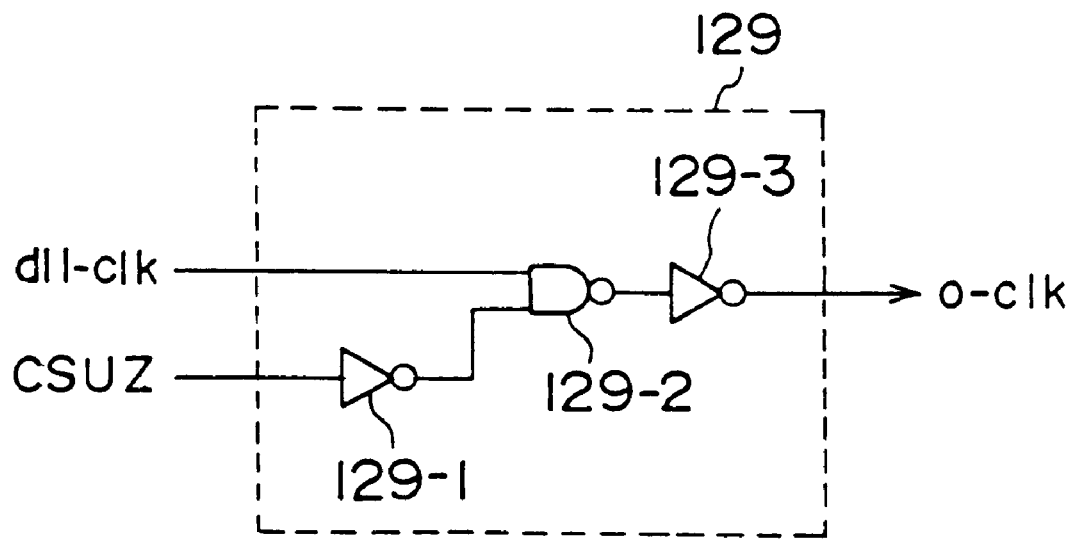
FIG. 9 is a circuit diagram of a clock-control circuit.
Figure 10:
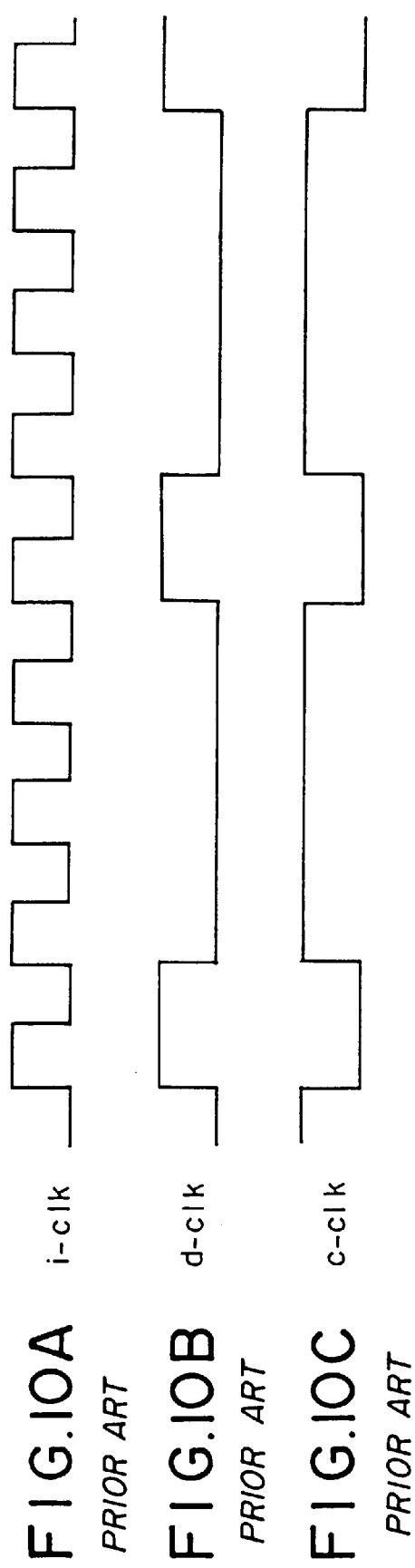
FIGS. 10A through 10C are timing charts showing operations of a frequency divider.
Figure 11:
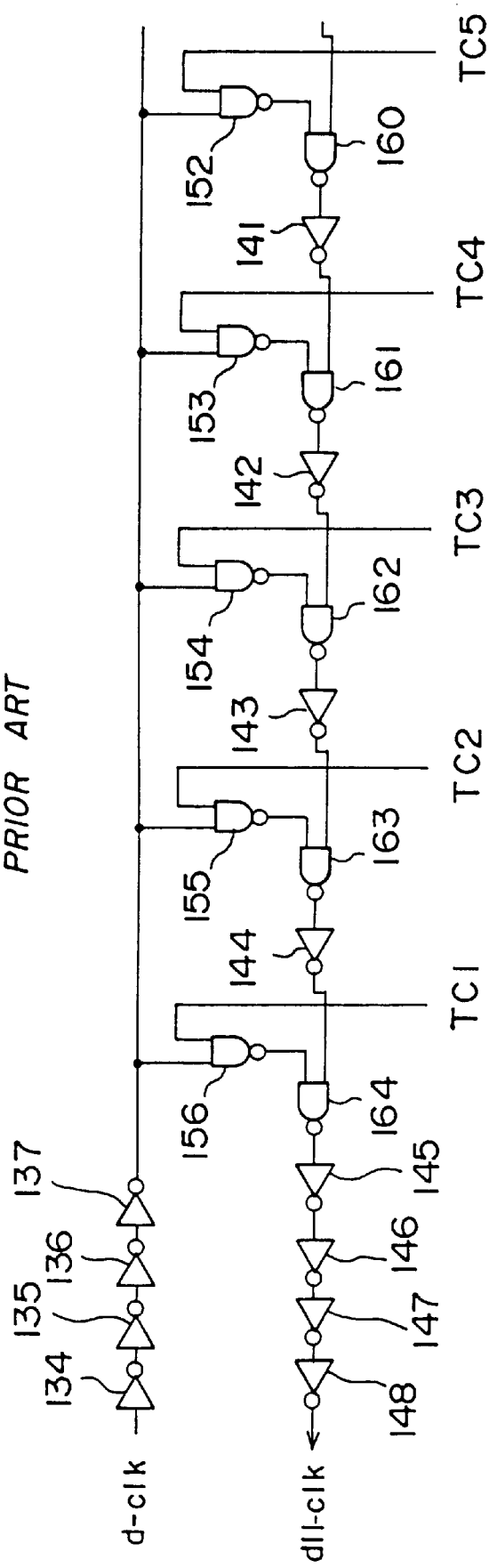
FIG. 11 is a circuit diagram showing a portion of a variable-delay circuit.
Figure 12:
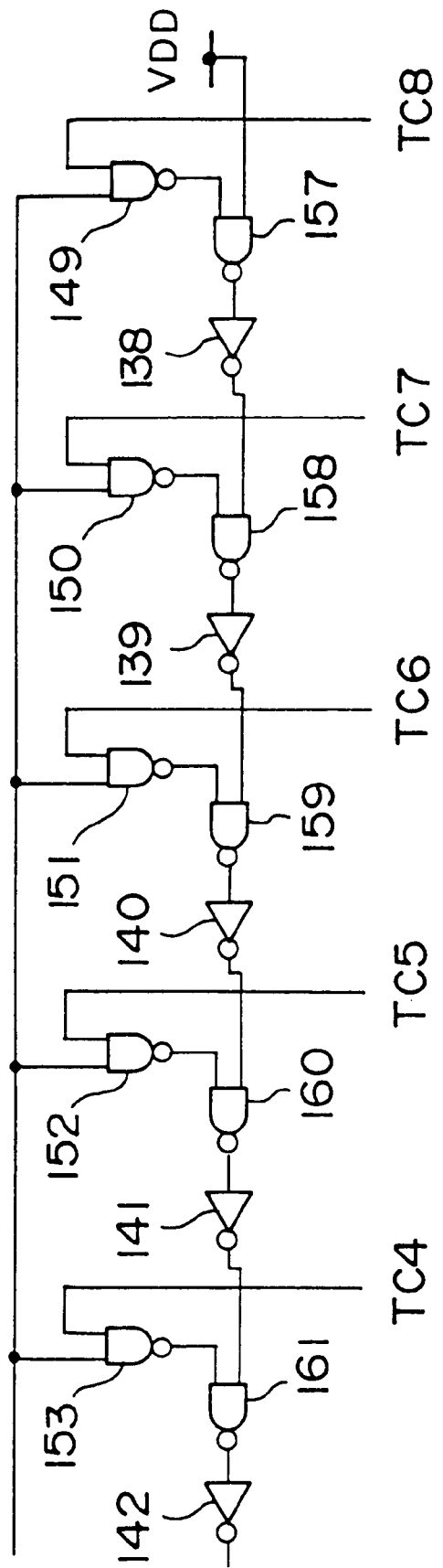
FIG. 12 is a circuit diagram showing a remaining portion of the variable-delay circuit.
Figure 13:
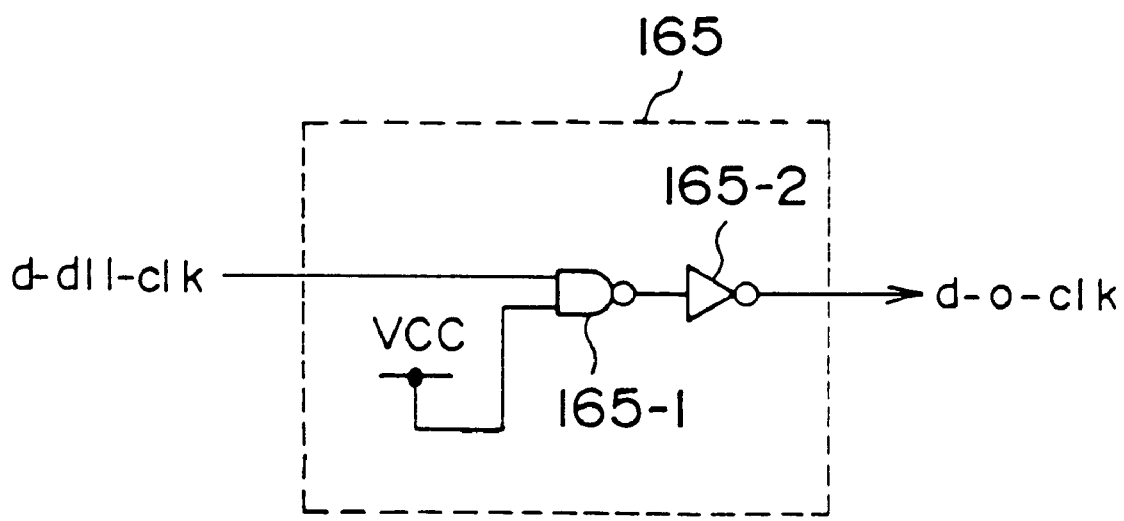
FIG. 13 is a circuit diagram of a clock-control circuit.
Figure 14:
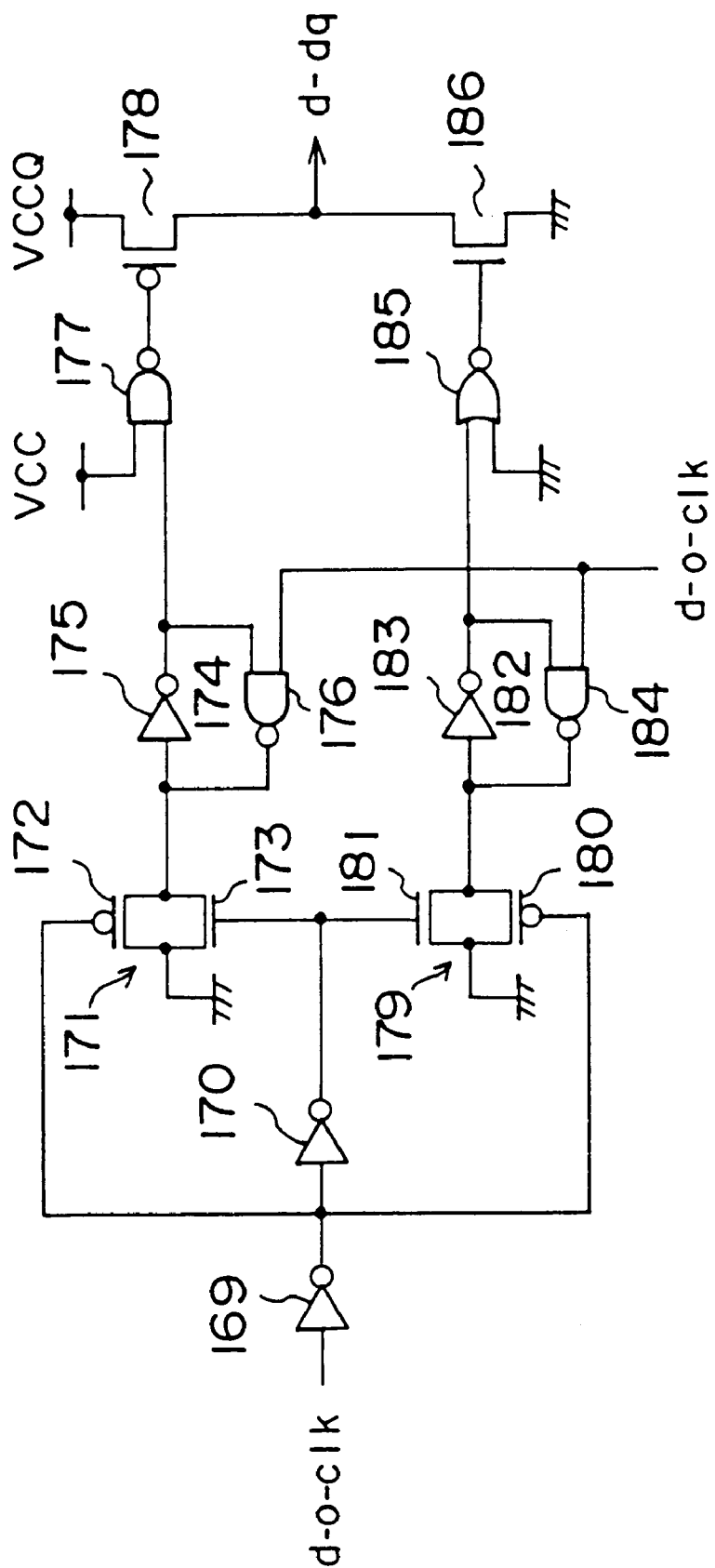
FIG. 14 is a circuit diagram of a data-output circuit.
Figure 15:
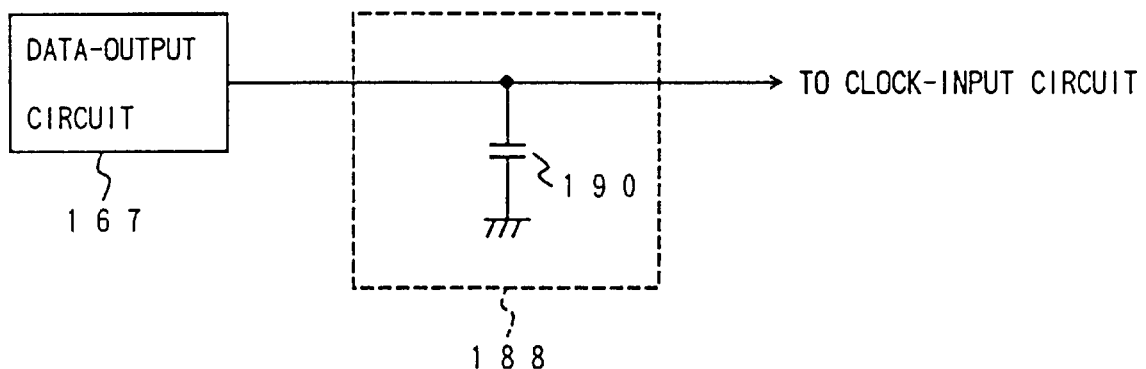
FIG. 15 is a circuit diagram of a load circuit.
Figure 16:
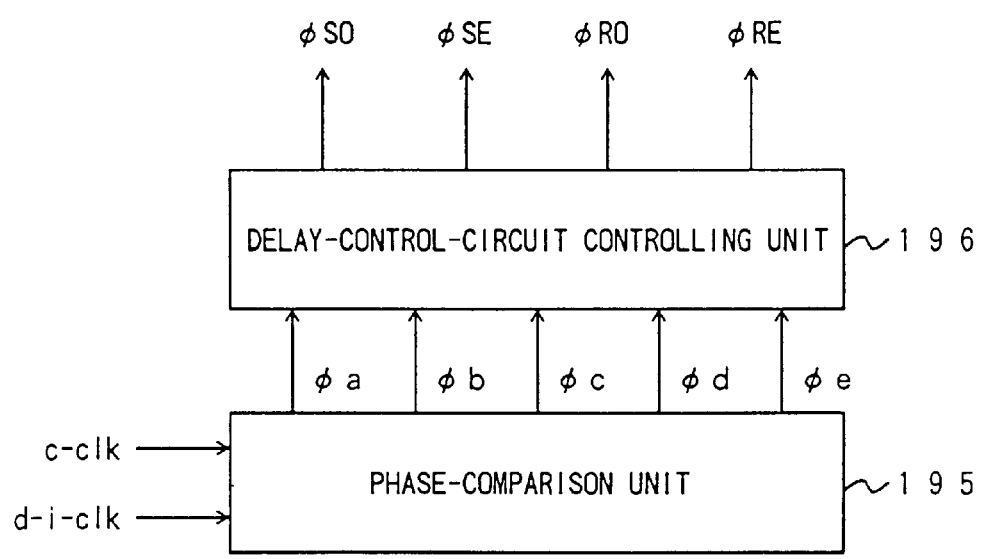
FIG. 16 is a block diagram of a phase comparator.

With reference to FIG. 35 again, variable-delay circuits 351-1 through 351-n have the same configuration as those of the variable-delay circuits 96 and 132 shown in FIG. 6. In FIG. 35, the variable-delay circuits 351-3 through 351-(m−1) and 351-(m+1) through 351-(n−1) are omitted for the sake of simplicity of the figure.

In the first embodiment of the present invention, a frequency-divided clock output from the variable-delay circuit 351-m is used as the reference clock c-clk.

A phase comparator 352 has the same configuration as the phase comparator 193 of FIG. 6. The phase comparator 352 compares phases between the frequency-divided clock a02 from the frequency divider 318 and a frequency-divided clock a03 from the variable-delay circuit 351-n.

A delay-control circuit 353 has the same configuration as the delay-control circuit 252 of FIG. 6. The delay-control circuit 353 controls the delay of the variable-delay circuits 351-1 through 351-n based on phase-comparison signals provided from the phase comparator 352.

Figure 37:
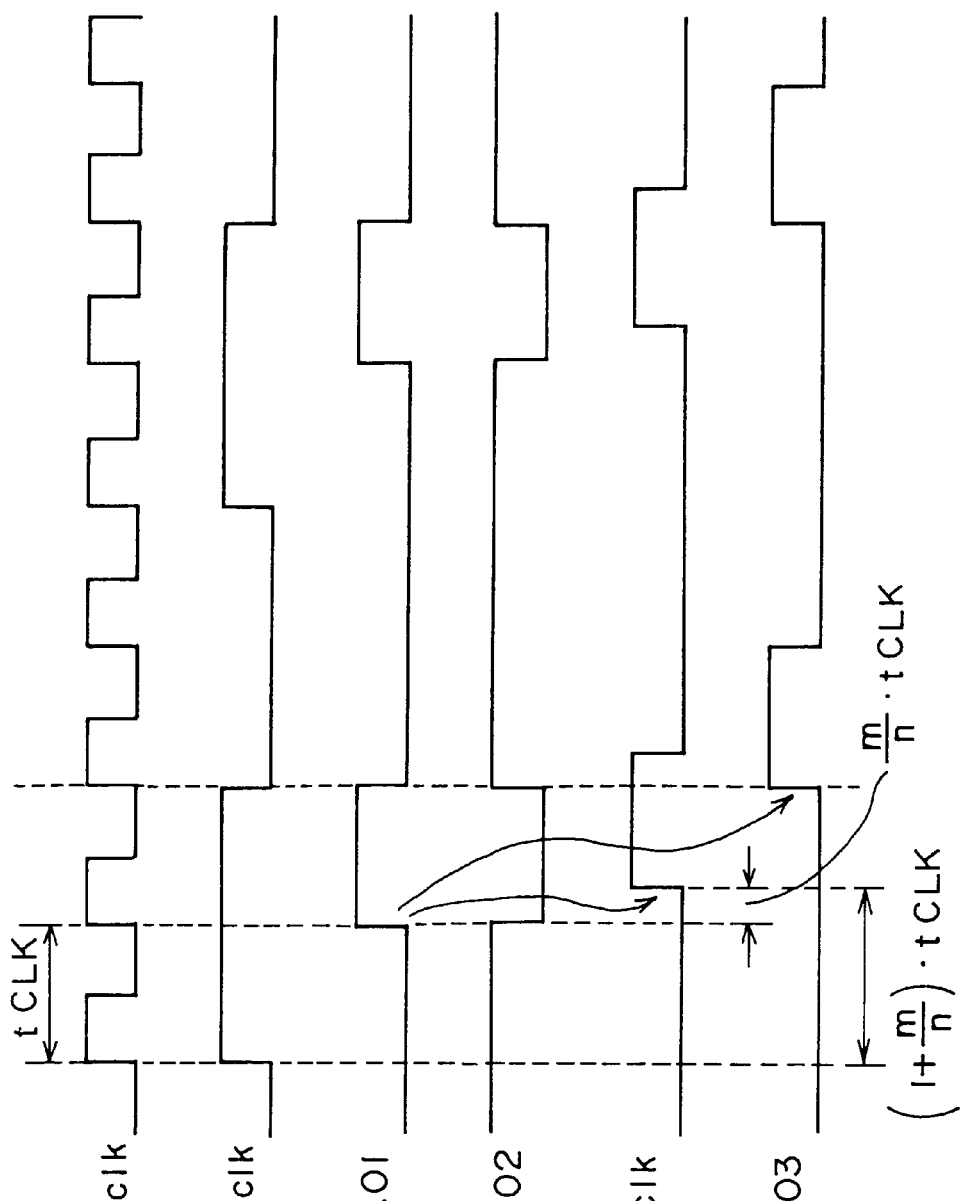
FIGS. 37A through 37F are timing charts showing operations of the frequency divider.

FIGS. 37A through 37F are timing charts showing operations of the frequency divider 315. FIG. 37A shows the internal clock i-clk, and FIG. 37B exhibits the dummy clock d-clk. FIG. 37C illustrates the frequency-divided clock a01, and FIG. 37D demonstrates the frequency-divided clock a02. Further, FIG. 37E displays the reference clock c-clk, and FIG. 37F shows the frequency-divided clock a03.

As shown in the figures, the frequency divider 315 adjusts a phase of the frequency-divided clock a03 such that rising edges of the frequency-divided clock a03 are in synchronism with rising edges of the frequency-divided clock a02. This is achieved by the delay-control circuit 353 controlling the variable-delay circuits 351-1 through 351-n.

The reference clock c-clk is the frequency-divided clock which is output from the variable-delay circuit 351-m. Because of this, the reference clock c-clk is delayed compared to the frequency-divided clock a01 by a delay time (m/n)×tCLK, where one cycle of the external clock CLK is represented as tCLK.

Namely, a total delay of the variable-delay circuit 132, a clock-control circuit 359 (which will be described later), the data-output circuit 167, and a clock-input circuit 355 (see a description provided later) is (1+m/n)×tCLK. The reference clock c-clk thus has a rising edge which is delayed by (1+m/n)×tCLK from a rising edge of the dummy clock d-clk.

With reference to FIG. 33 again, the DLL circuit 316 differs from the delayed-synchronous-loop circuit 131 of FIG. 6 only in that the clock-input circuit 192 and the clock-control circuit 165 are replaced by the clock-input circuit 355 and the clock-control circuit 359, respectively.

The clock-input circuit 355 has the same configuration as the clock-input circuit 311 for emulating the clock-input circuit 311.

FIG. 38 is a circuit diagram of the clock-control circuit 359. As shown in the figure, the clock-control circuit 359 includes NAND circuits 368 and 369. The NAND circuit 368 takes a NAND operation between the delayed dummy clock d-dll-clk and the power voltage VCC. The NAND circuits 369 takes a NAND operation between the power voltage VCC and an output of the NAND circuit 368 to produce the dummy output-control clock d-o-clk.

Figure 39:
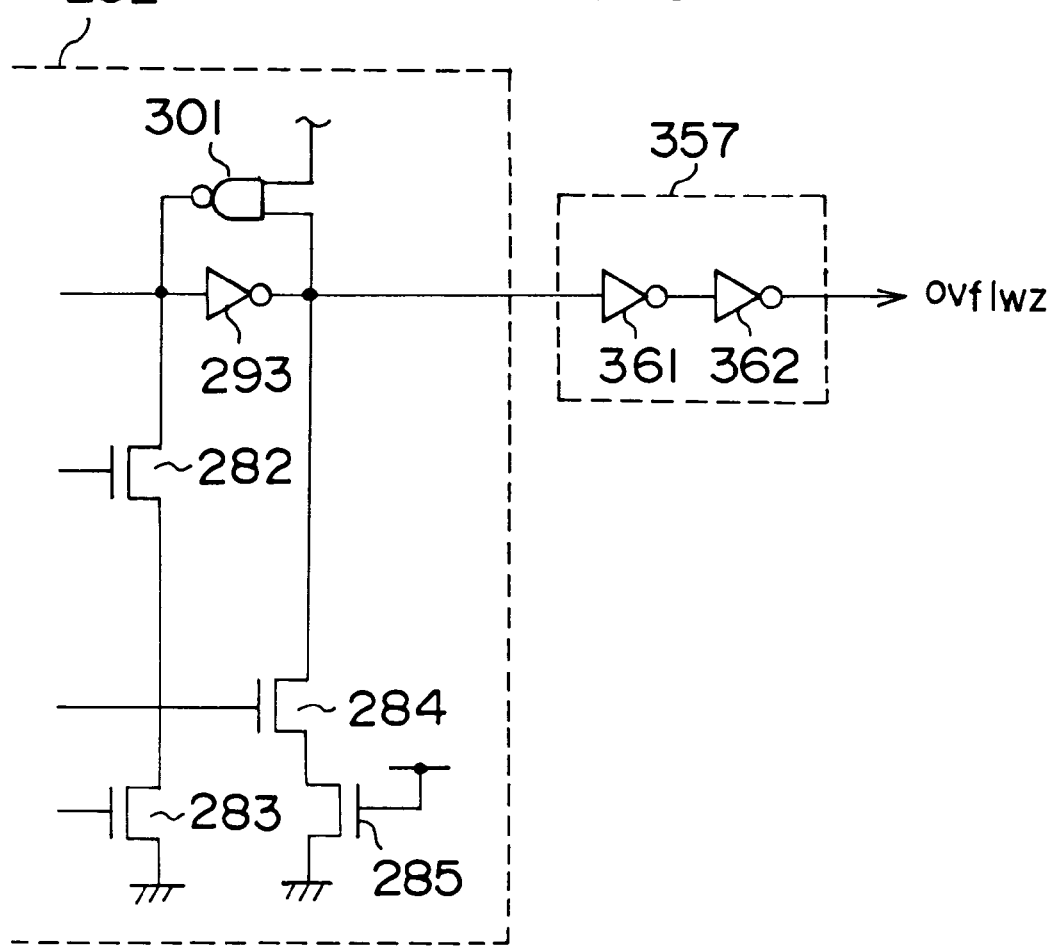
FIG. 39 is a circuit diagram of an overflow-detection circuit.

FIG. 39 is a circuit diagram of the overflow-detection circuit 357. In FIG. 39, the overflow-detection circuit 357 includes inverters 361 and 362. The inverter 361 inverts an output of the inverter 293 of the delay-control circuit 252. The inverter 362 inverts an output of the inverter 361 to output the overflow-detection signal ovflwz.

The overflow-detection circuit 357 functions as a clock-selection-signal-supply circuit for providing the overflow-detection signal ovflwz as a clock-selection signal for the clock-control circuit 358.

In the delay-control circuit 252, the output of the inverter 293 is HIGH during normal operations thereof. When the delay of the variable-delay circuits 96 and 132 becomes a maximum delay thereof, however, the output of the inverter 293 becomes HIGH, indicating that all the delay stages of the variable-delay circuits 96 and 132 are used up.

Namely, the overflow-detection signal ovflwz is LOW in a normal condition, but becomes HIGH when all the delay stages of the variable-delay circuits 96 and 132 are used up to provide the maximum delay.

When the overflow-detection signal ovflwz is LOW, the output of the inverter 365 in the clock-control circuit 358 shown in FIG. 34 is HIGH. In this case, the NAND circuit 366 serves as an inverter with respect to the delayed clock dll-clk, and the NAND circuit 364 produces a HIGH output. The NAND circuit 367 works as an inverter for the output of the NAND circuit 366.

Accordingly, the clock-control circuit 358 generates the output-control clock o-clk which is the delayed clock dll-clk delayed by the NAND circuits 366 and 367.

In the clock-control circuit 359 of FIG. 38, the delayed dummy clock d-dll-clk is output as the dummy output-control clock d-o-clk after incurring delays through the NAND circuits 368 and 369.

When the overflow-detection signal ovflwz is HIGH, one the other hand, the NAND circuit 364 in the clock-control circuit 358 shown in FIG. 34 serves as an inverter for the internal clock i-clk. Also, the output of the inverter 365 is fixed at the LOW level, so that the output of the NAND circuit 366 is kept at the HIGH level. The NAND circuit 367 then serves as an inverter for the output of the NAND circuit 364.

Accordingly, the clock-control circuit 358 generates the output-control clock o-clk which is the internal clock i-clk delayed by the NAND circuits 364 and 367.

According to the first embodiment of the present invention, therefore, the data-output circuit 13 outputs the output data DQ having an output timing as described below.

Figure 40:
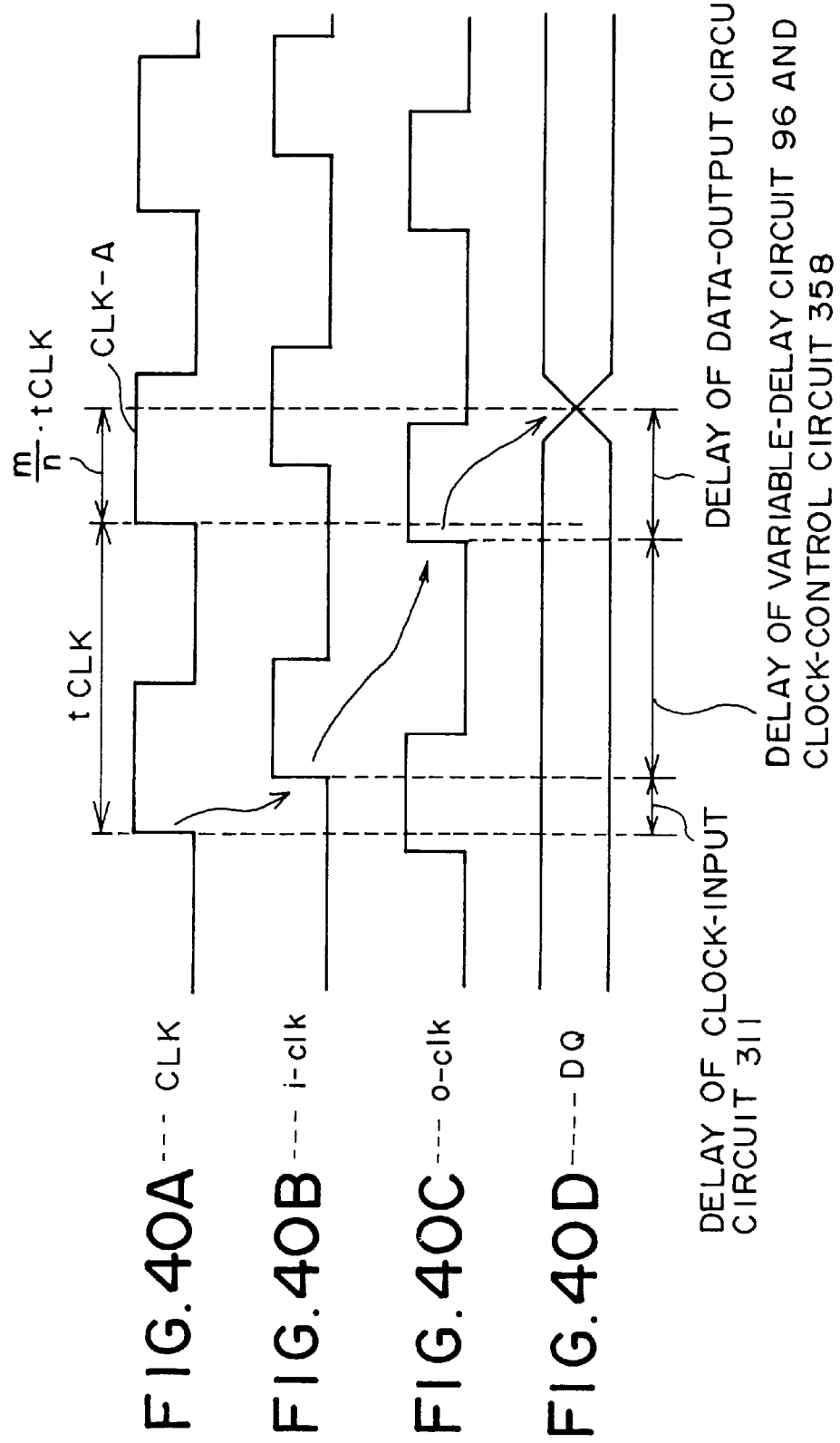
FIGS. 40A through 40D are timing charts showing an output timing of output data DQ output from the data-output circuit in the first embodiment of the present invention.

FIGS. 40A through 40D are timing charts showing an output timing of the output data DQ output from the data-output circuit 13 in the first embodiment of the present invention. FIG. 40A shows the external clock CLK, and FIG. 40B exhibits the internal clock i-clk. Further, the output-control clock o-clk is illustrated in FIG. 40C, and the output data DQ is shown in FIG. 40D.

In the first embodiment of the present invention, the total delay of the variable-delay circuit 132, the clock-control circuit 359, the data-output circuit 167, and the clock-input circuit 355 is equal to $(1+m/n) \times tCLK$, as previously described.

As a result, the delays of the clock-input circuit 311, the variable-delay circuit 96, the clock-control circuit 358, and the data-output circuit 13 should also amount to the total delay of $(1+m/n) \times tCLK$. That is, this total delay can never be equal to one clock cycle tCLK.

As shown in FIGS. 40A through 40D, therefore, the output data DQ is not sent out at the timing of a rising edge of the external clock CLK-A (which is an access clock pulse). Rather, the output data DQ appears $(m/n) \times tCLK$ after a rising edge of the external clock CLK-A, thereby securing an appropriate data-hold time.

Figure 41:
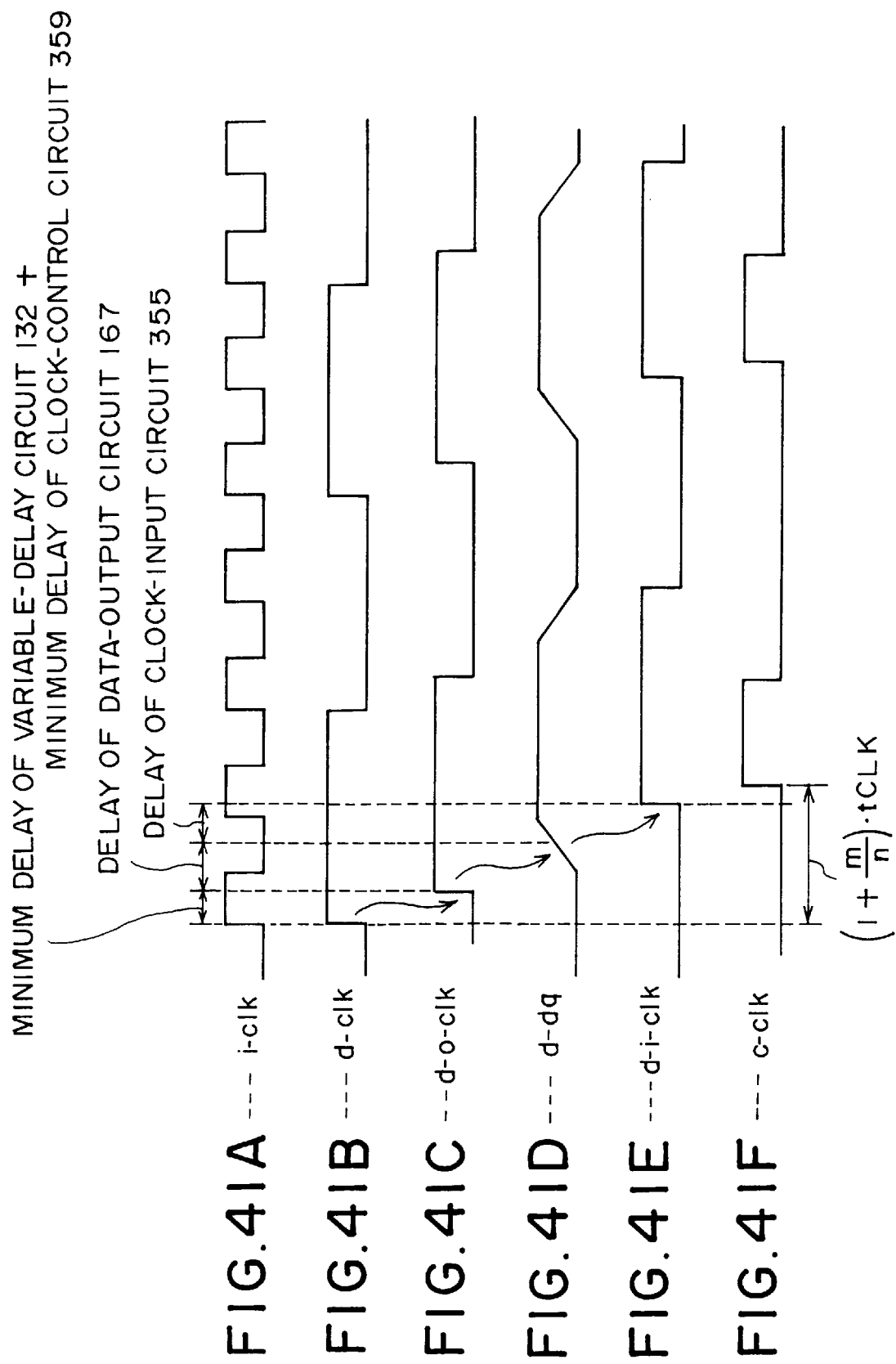
FIGS. 41A through 41F are timing charts showing operations of a DLL circuit when a delay of the variable-delay circuit is set to the smallest.

FIGS. 41A through 41F are timing charts showing operations of the DLL circuit 316 when the delay of the variable-delay circuit 132 is set to the smallest. FIG. 41A shows the internal clock i-clk, and FIG. 41B exhibits the dummy clock d-clk. FIG. 41C illustrates the dummy output-control clock d-o-clk. Further, FIGS. 41D through 41F show the dummy output data d-dq, the dummy internal clock d-i-clk, and the reference clock c-clk, respectively.

As shown in FIGS. 41A through 41F, the first embodiment of the present invention can lock the dummy internal clock d-i-clk so as to establish synchronism with the reference clock c-clk. This is because even when the total delay of the variable-delay circuit 132, the clock-control circuit 359, the data-output circuit 167, and the clock-input circuit 355 becomes longer than the clock cycle tCLK of the external clock CLK as the frequency of the external clock CLK is increased, a difference in rising-edge timings between the dummy clock d-clk and the reference clock c-clk is kept constant at $(1+m/n) \times tCLK$. With this timing difference, elongation of the delay of the variable-delay circuit 132 should ensure the lock of clock signals.

Figure 42:
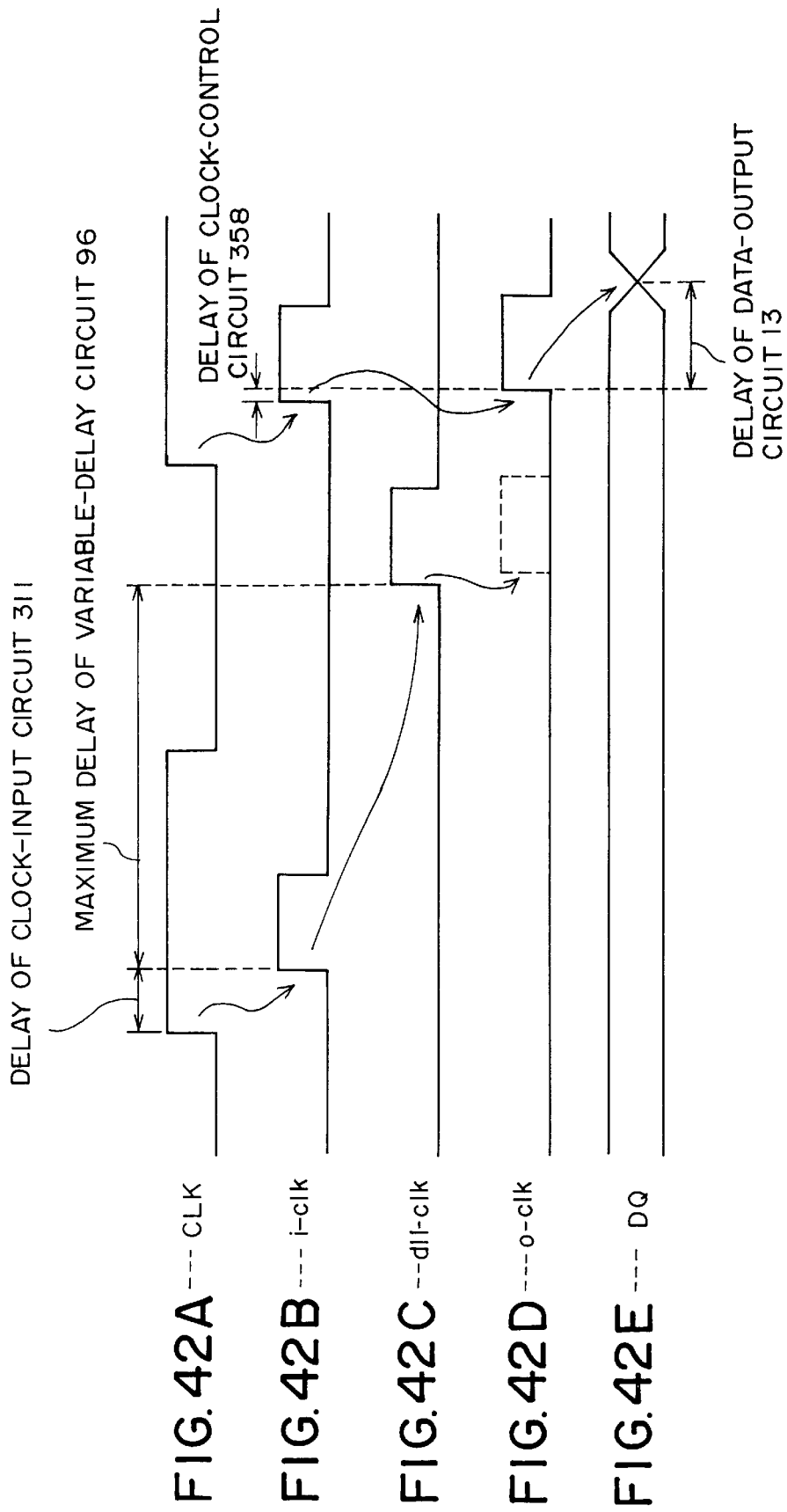
FIGS. 42A through 42E are timing charts showing an output timing of the output data DQ when an overflow-detection signal ovflwz is HIGH.

FIGS. 42A through 42E are timing charts showing an output timing of the output data DQ when the overflow-detection signal ovflwz is HIGH. As previously described, the overflow-detection signal ovflwz becomes HIGH when the delay of the variable-delay circuits 96 and 132 reach the maximum delay by using up all the delay stages thereof. FIG. 42A shows the external clock CLK, and FIG. 42B exhibits the internal clock i-clk. FIGS. 42C through 42E illustrate the delayed clock dll-clk, the output-control clock o-clk, and the output data DQ, respectively.

As shown in FIGS. 42A through 42E, the first embodiment of the present invention ensures that the output data DQ is output after the passage of the delay time of the data-output circuit 13 starting from a rising-edge timing of the internal clock i-clk. This is because the clock-control circuit 358 outputs the output-control clock o-clk by delaying the internal clock i-clk by the delay time of the clock-control circuit 358 when the delay of the variable-delay circuit 96 reaches the maximum delay by using up all the delay stages.

Accordingly, even when the delay of the variable-delay circuit 96 reaches the maximum delay as the external clock CLK decreases the frequency thereof, an appropriate data-hold time can be secured. In other words, even when the variable-delay circuit 96 cannot offer a sufficient delay, a data-hold time should be still appropriate.

Figure 43:
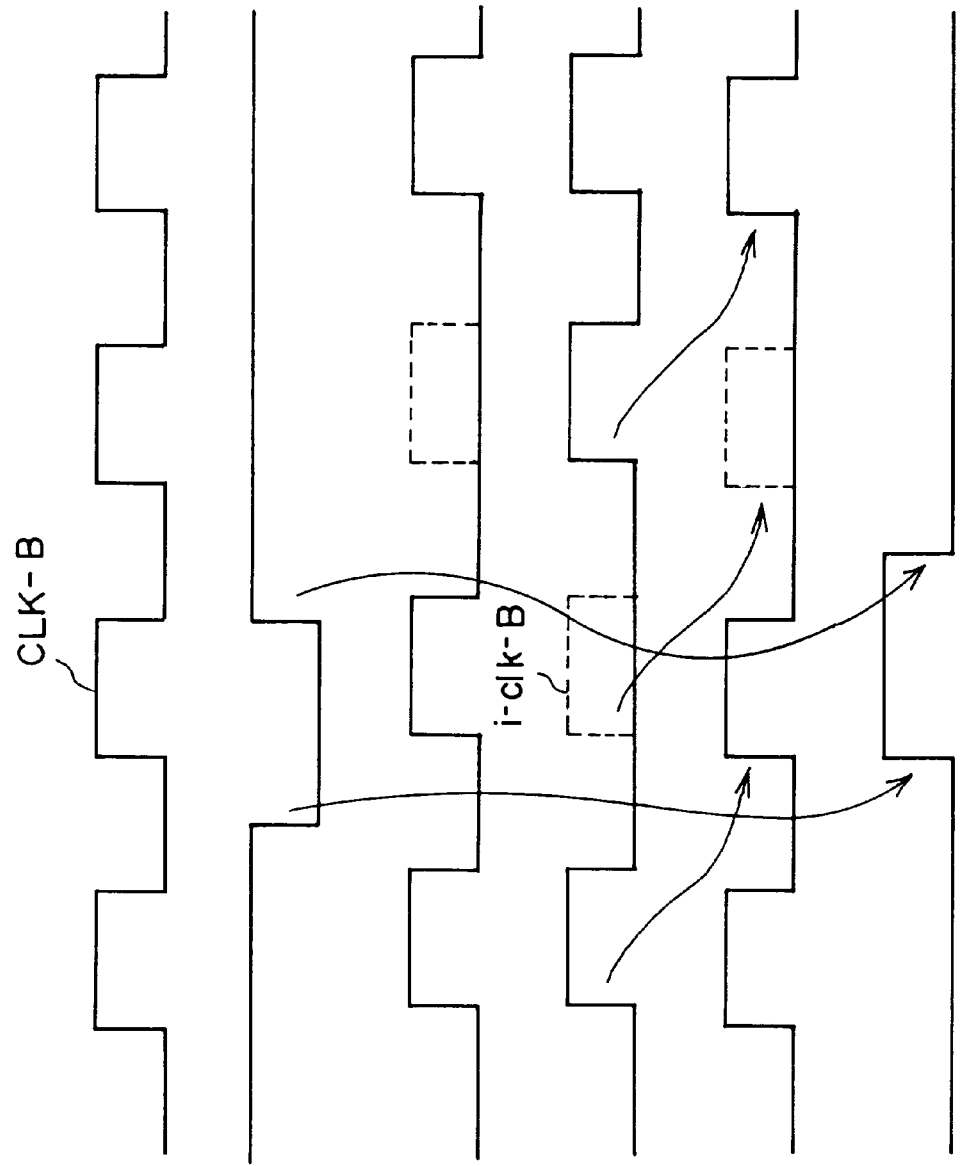
FIGS. 43A through 43F are timing charts for explaining a clock-suspend mode in the first embodiment of the present invention.

FIGS. 43A through 43F are timing charts for explaining a clock-suspend mode in the first embodiment of the present invention. FIG. 43A shows the external clock CLK, and FIG. 43B exhibits the clock-enable signal CKE. FIG. 43C illustrates the output-control clock o-clk obtained from the catalogue, and FIG. 43D demonstrates the internal clock i-clk. Further, FIG. 43E shows the output-control clock o-clk actually used during operations, and FIG. 43F displays the clock-suspend signal csuz.

As shown in FIGS. 43A through 43F, the clock-suspend signal csuz rises from LOW to HIGH without waiting for the external clock CLK to change from LOW to HIGH when a clock-suspend mode is indicated. In order to indicate the clock-suspend mode, the clock-enable signal CKE is changed from HIGH to LOW during a LOW period of the external clock CLK.

As a result, the clock-input circuit 311 (see FIG. 32) has the inverter 382 outputting LOW and the NAND circuit 383 outputting HIGH. In this condition, the internal clock i-clk is LOW, i.e., the external clock CLK-B of FIG. 43A is not detected. As shown in FIG. 43D, the internal clock i-clk-B is not generated at a timing corresponding to the external clock CLK-B.

Accordingly, the variable-delay circuit 96 does not perform the operation to delay the internal clock i-clk-B since there is no internal clock i-clk-B.

As described above, the first embodiment of the present invention can secure an appropriate data-hold time because the output timing of the output data DQ is delayed by $(m/n) \times tCLK$ from a rising edge of the external clock CLK-A. The first embodiment thus can enhance reliability.

Further, the first embodiment of the present invention can lock the dummy internal clock d-i-clk on to the reference clock c-clk so as to establish synchronism even when the total delay of the variable-delay circuit 132, the clock-control circuit 359, the data-output circuit 167, and the clock-input circuit 355 becomes longer than the clock cycle tCLK of the external clock CLK as the frequency of the external clock CLK is increased. The first embodiment achieves this by employing a configuration in which a difference in rising-edge timings between the dummy clock d-clk and the reference clock c-clk is set to $(1+m/n) \times tCLK$ so as to provide a sufficient phase margin between the dummy internal clock d-i-clk and the reference clock c-clk.

Moreover, the first embodiment of the present invention can secure an appropriate data-hold time to achieve stable data access even when the external clock CLK decreases the frequency thereof such that the variable-delay circuit 96 has the delay thereof reaching the maximum delay and fails to offer a sufficient delay. The first embodiment achieves this based on a configuration in which the clock-control circuit 358 outputs the output-control clock o-clk by delaying the internal clock i-clk by the delay of the clock-control circuit 358 when the variable-delay circuit 96 has the delay thereof reaching the maximum delay after using up all the delay stages.

Also, the first embodiment can achieve a reduction in power consumption in the variable-delay circuits 96 and 132 by preventing the internal clock i-clk from being generated. The blocking of the internal clock i-clk is effected by changing the clock-suspend signal csuz from LOW to HIGH immediately after the clock-enable signal CKE is turned from HIGH to LOW, without latching the clock-enable signal CKE at a rising edge of the external clock CLK.

In what follows, a second embodiment of the present invention will be described with reference to the accompanying drawings.

Figure 44:
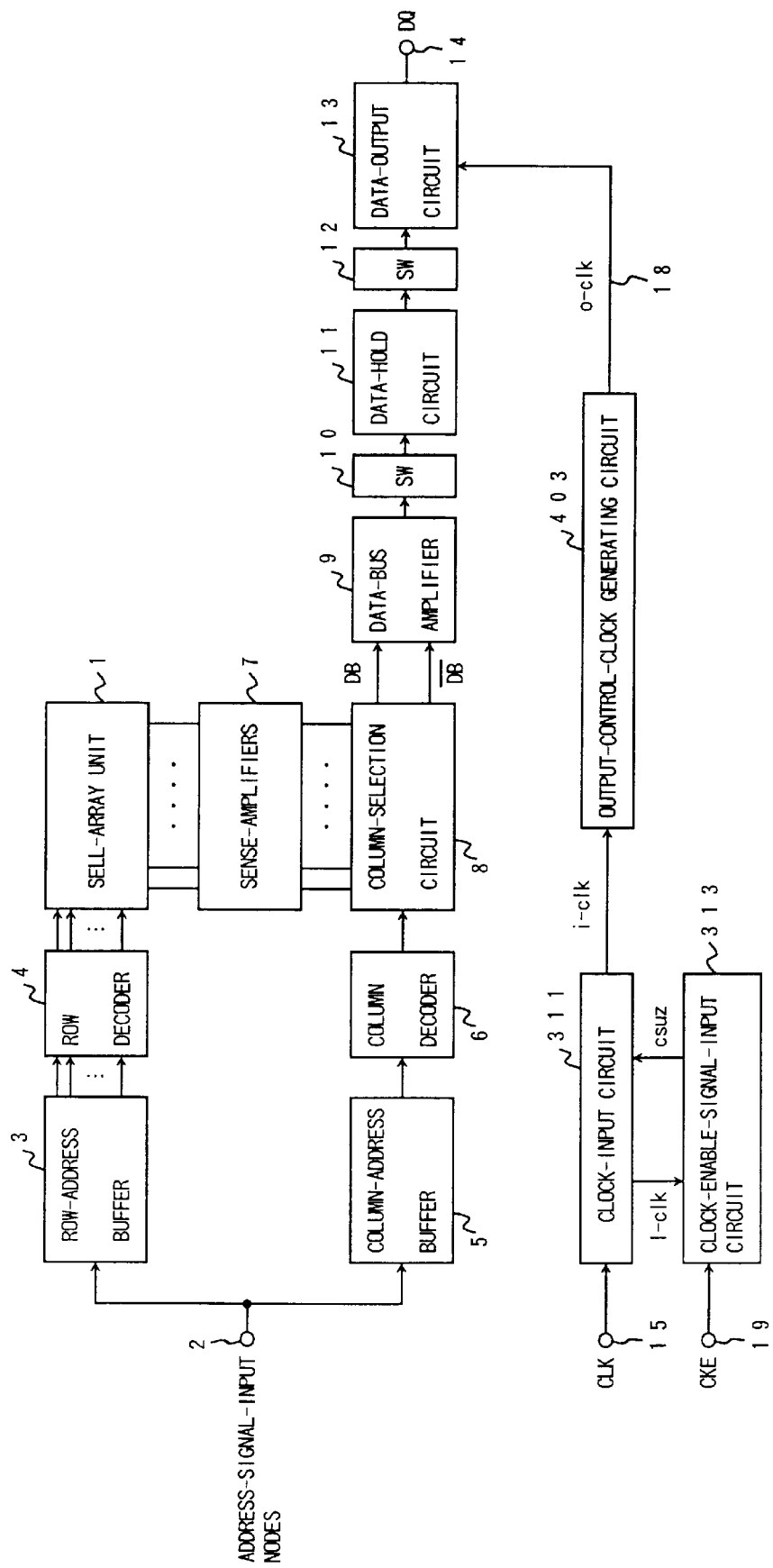
FIG. 44 is a block diagram showing a relevant part of a second embodiment of the present invention.

FIG. 44 is a block diagram showing a relevant part of a second embodiment of the present invention. In FIG. 44, the same elements as those of FIG. 31 are referred to by the same numerals, and a description thereof will be omitted. An SDRAM of FIG. 44 differs from the SDRAM of FIG. 31 only in that the output-control-clock generating circuit 312 is replaced by an output-control-clock generating circuit 403.

Figure 45:
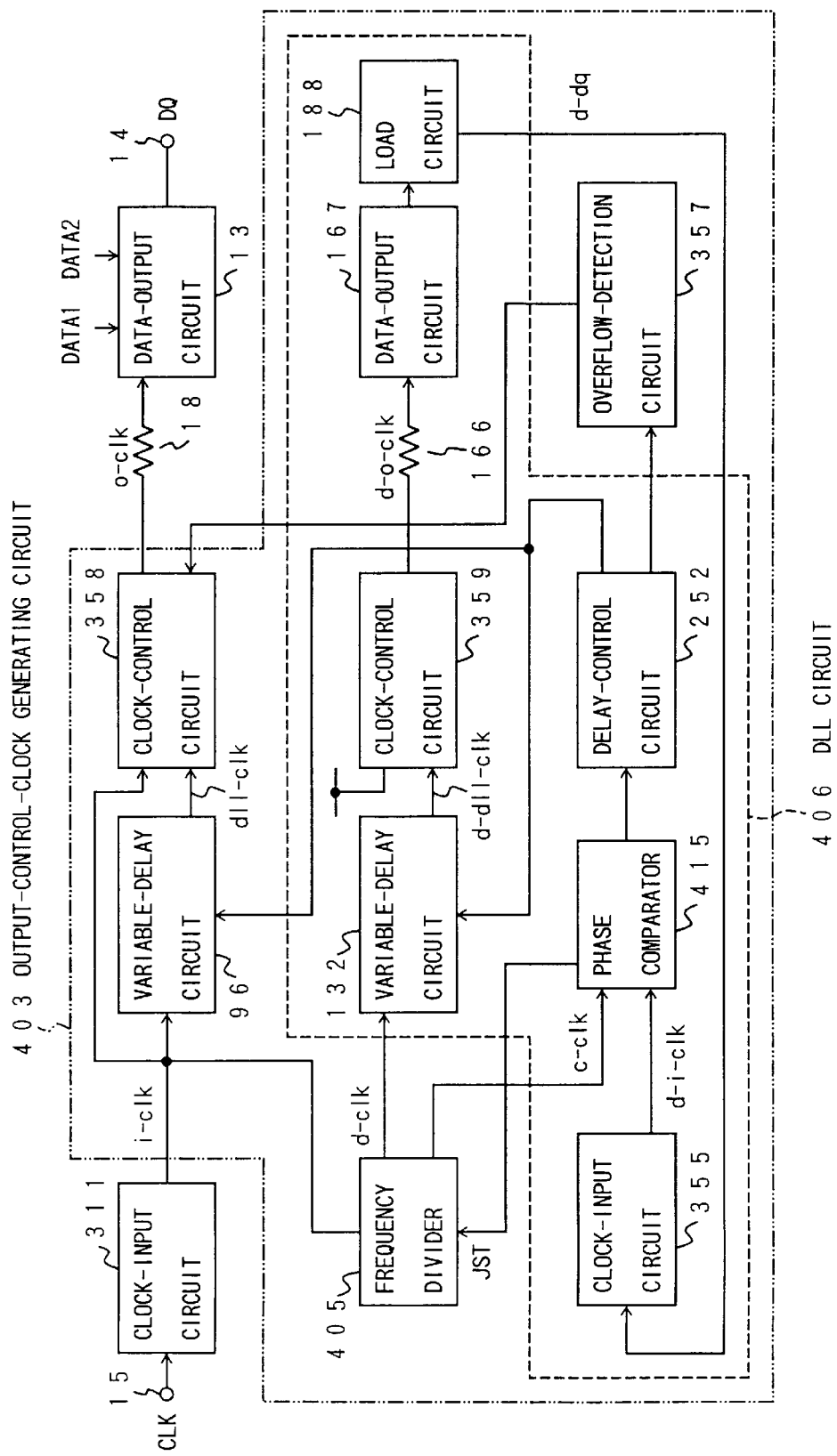
FIG. 45 is a circuit diagram of an output-control-clock generating circuit.

FIG. 45 is a circuit diagram of the output-control-clock generating circuit 403. The output-control-clock generating circuit 403 of FIG. 45 differs from the output-control-clock generating circuit 312 of FIG. 33 in that the frequency divider 315 and DLL circuit 316 are replaced by a frequency divider 405 and a DLL circuit 406, respectively.

The frequency divider 405 is the same as the frequency divider 315 shown in FIG. 35, except that a frequency divider 408 is provided in place of the frequency divider 318.

FIG. 46 is a circuit diagram of the frequency divider 408. In FIG. 46, a frequency divider 409 has the same configuration as the frequency divider 318 of FIG. 35. Output nodes 409A through 409C of the frequency divider 409 correspond to the output nodes 318A through 318C of the frequency divider 318, respectively.

A frequency-divided clock C409A output from the output node 409A of the frequency divider 409 is a clock of the same type as the dummy clock d-clk shown in FIG. 37B. A frequency-divided clock C409B from the output node 409B is the same as the frequency-divided clock a01 shown in FIG. 37C. Further, the output node 409C outputs a frequency-divided clock C409C the same type as the frequency-divided clock a02 of FIG. 37D.

A one-eighth frequency divider 410 divides the frequency of the internal clock i-clk in a ratio of one to eight, and is controlled by a synchronization-detection signal JST, which will be later described. The one-eighth frequency divider 410 generates a HIGH-level output when the synchronization-detection signal JST is LOW. When the synchronization-detection signal JST is HIGH, on the other hand, the one-eighth frequency divider 410 outputs a frequency-divided clock C410, which is obtained through the one-to-eight frequency division of the internal clock i-clk.

An AND circuit 411 takes an AND operation between the frequency-divided clock C409A from the output node 409A and an output of the one-eighth frequency divider 410. The AND circuit 411 outputs the dummy clock d-clk.

An AND circuit 412 takes an AND operation between the frequency-divided clock C409B from the output node 409B and the output of the one-eighth frequency divider 410. The AND circuit 412 outputs the frequency-divided clock a01.

An AND circuit 413 takes an AND operation between the frequency-divided clock C409C from the output node 409C and the output of the one-eighth frequency divider 410. The AND circuit 413 outputs the frequency-divided clock a02.

Figure 47:
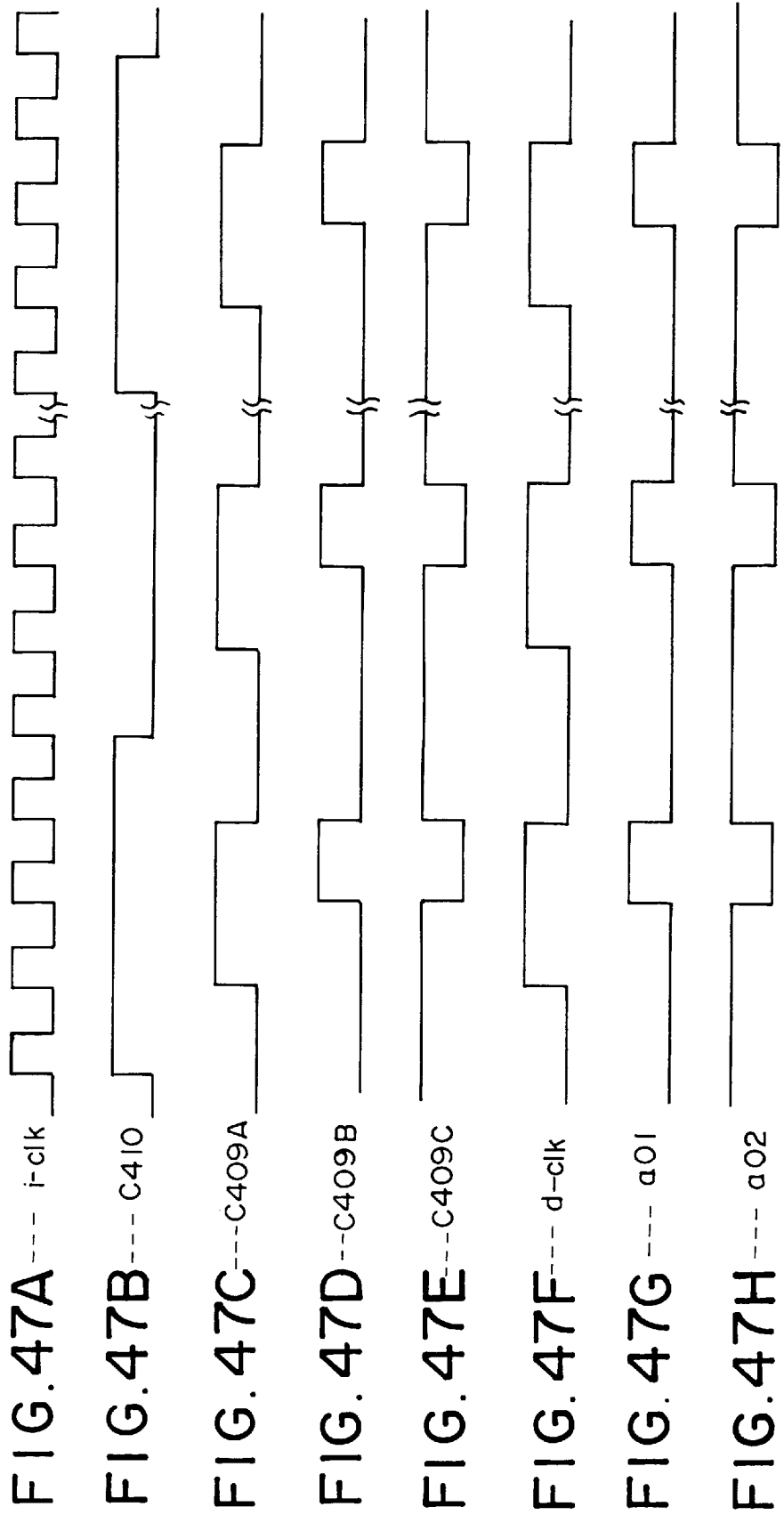
FIGS. 47A through 47H are timing charts showing operations of the frequency divider.

FIGS. 47A through 47H are timing charts showing operations of the frequency divider 408. FIG. 47A shows the internal clock i-clk, and FIG. 47B exhibits the frequency-divided clock C409A. FIGS. 47C through 47E illustrate the frequency-divided clocks C409A through C409C, respectively. FIG. 47F demonstrates the dummy clock d-clk. Further, FIGS. 47G and 47H show the frequency-divided clocks a01 and a02, respectively.

As shown in the figures, when the synchronization-detection signal JST is LOW, the frequency-divided clocks C409A through C409C from the frequency divider 409 are output as the dummy clock d-clk, the frequency-divided clock a01, and the frequency-divided clock a02, respectively. When the synchronization-detection signal JST is HIGH, however, AND operations are taken between the frequency-divided clock C410 and the frequency-divided clocks C409A through C409C to generates output clock signals. In this case, therefore, the dummy clock d-clk, the frequency-divided clock a01, and the frequency-divided clock a02 are clock signals which are obtained by dividing the frequencies of the frequency-divided clocks C409A through C409C by a one-to-two ratio.

With reference to FIG. 45 again, the DLL circuit 406 of FIG. 45 differs from the DLL circuit 316 of FIG. 33 only in that the phase comparator 193 is replaced by the phase comparator 415.

Figure 21:
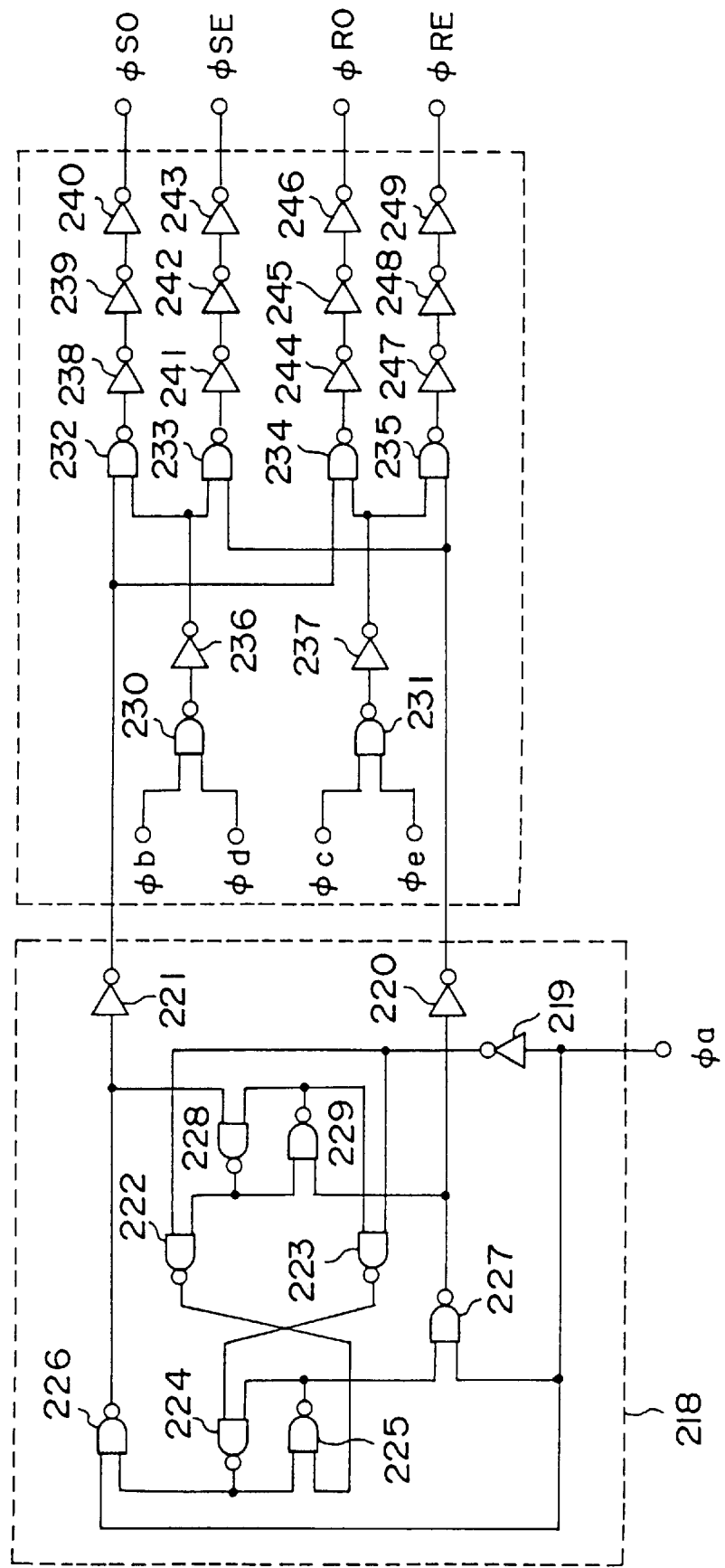
FIG. 21 is a circuit diagram of a delay-control-circuit controlling unit.
Figure 25:
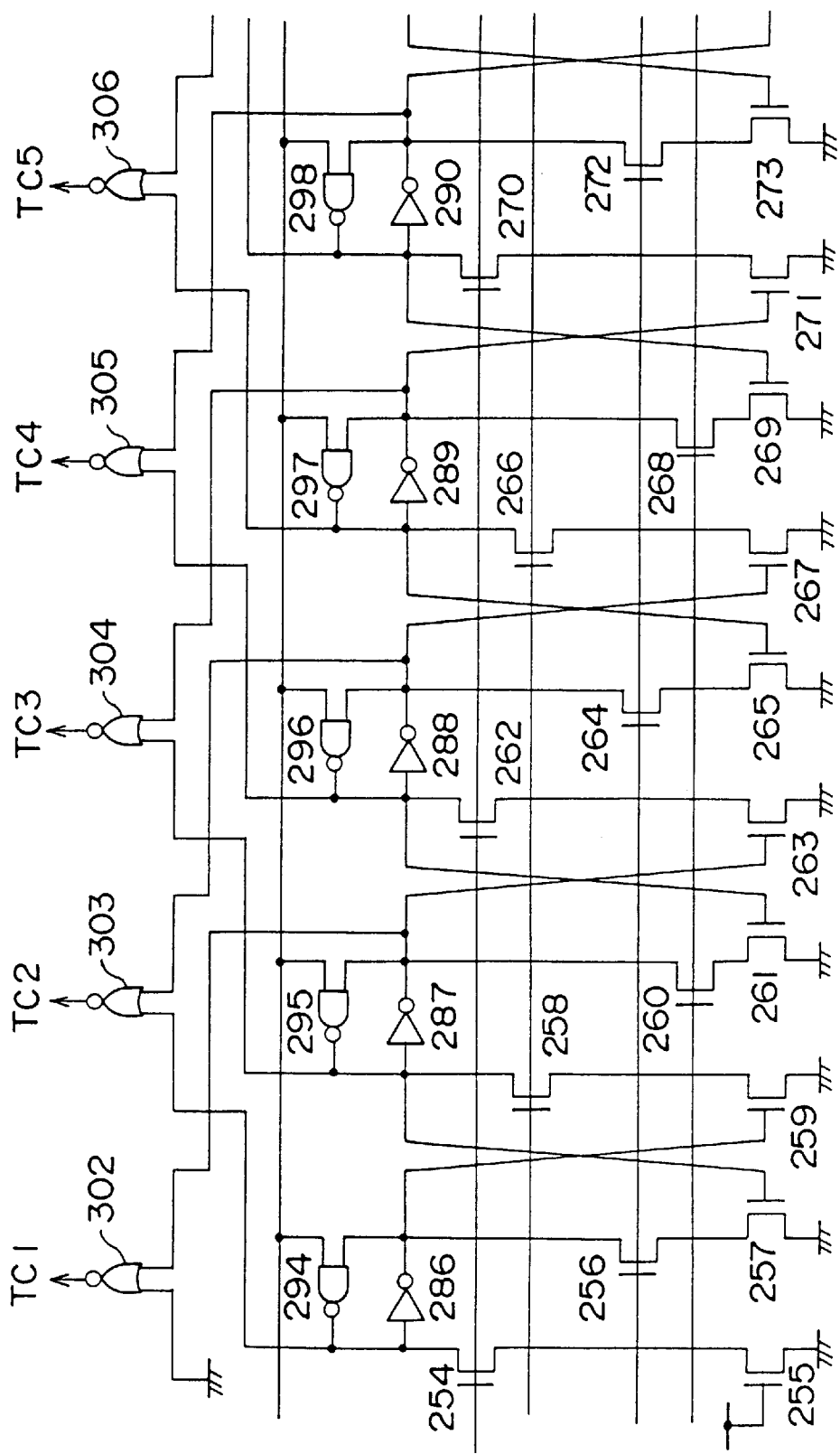
FIG. 25 is a circuit diagram of a portion of a delay-control circuit.
Figure 26:
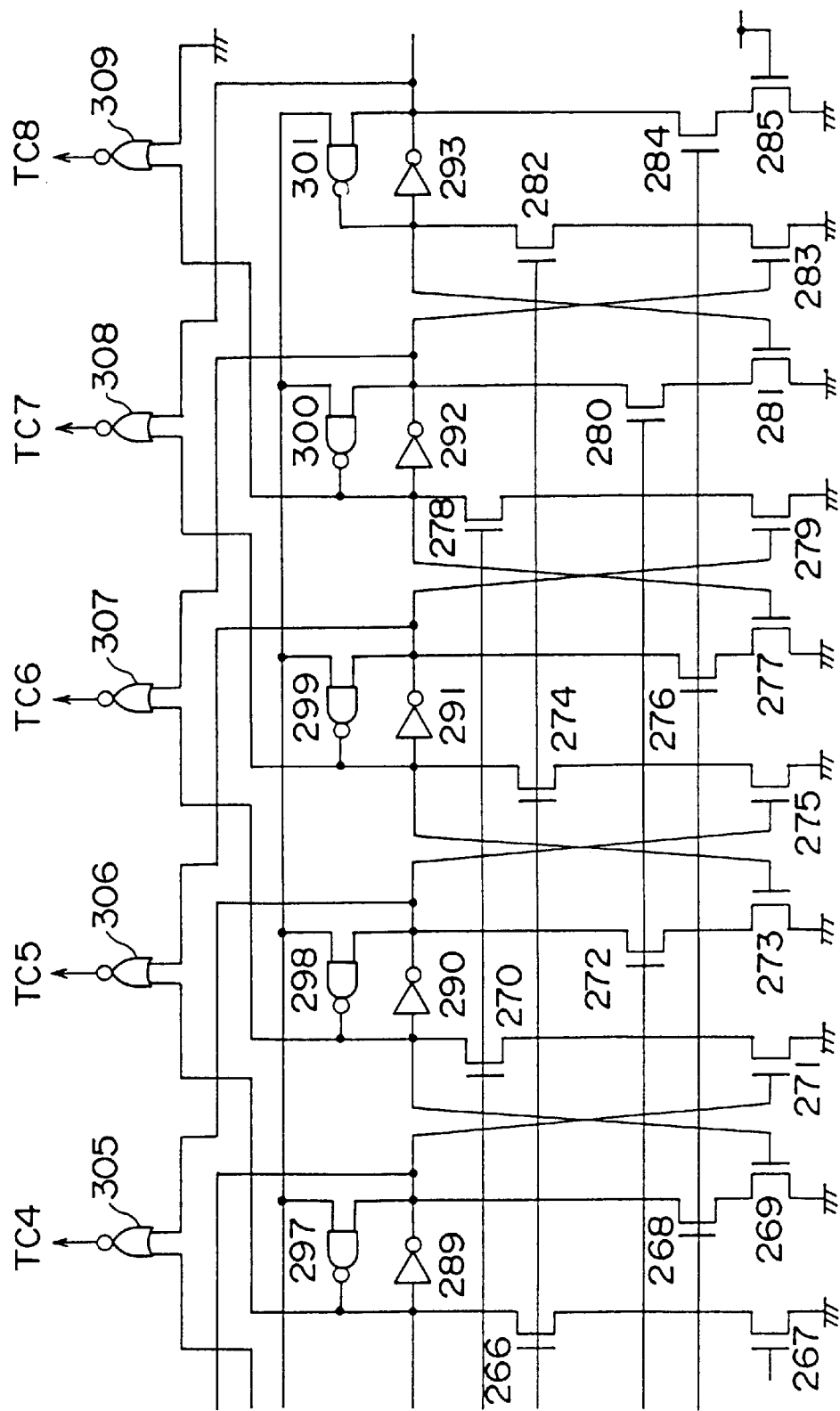
FIG. 26 is a circuit diagram of a remaining portion of the delay-control circuit.
Figure 27:
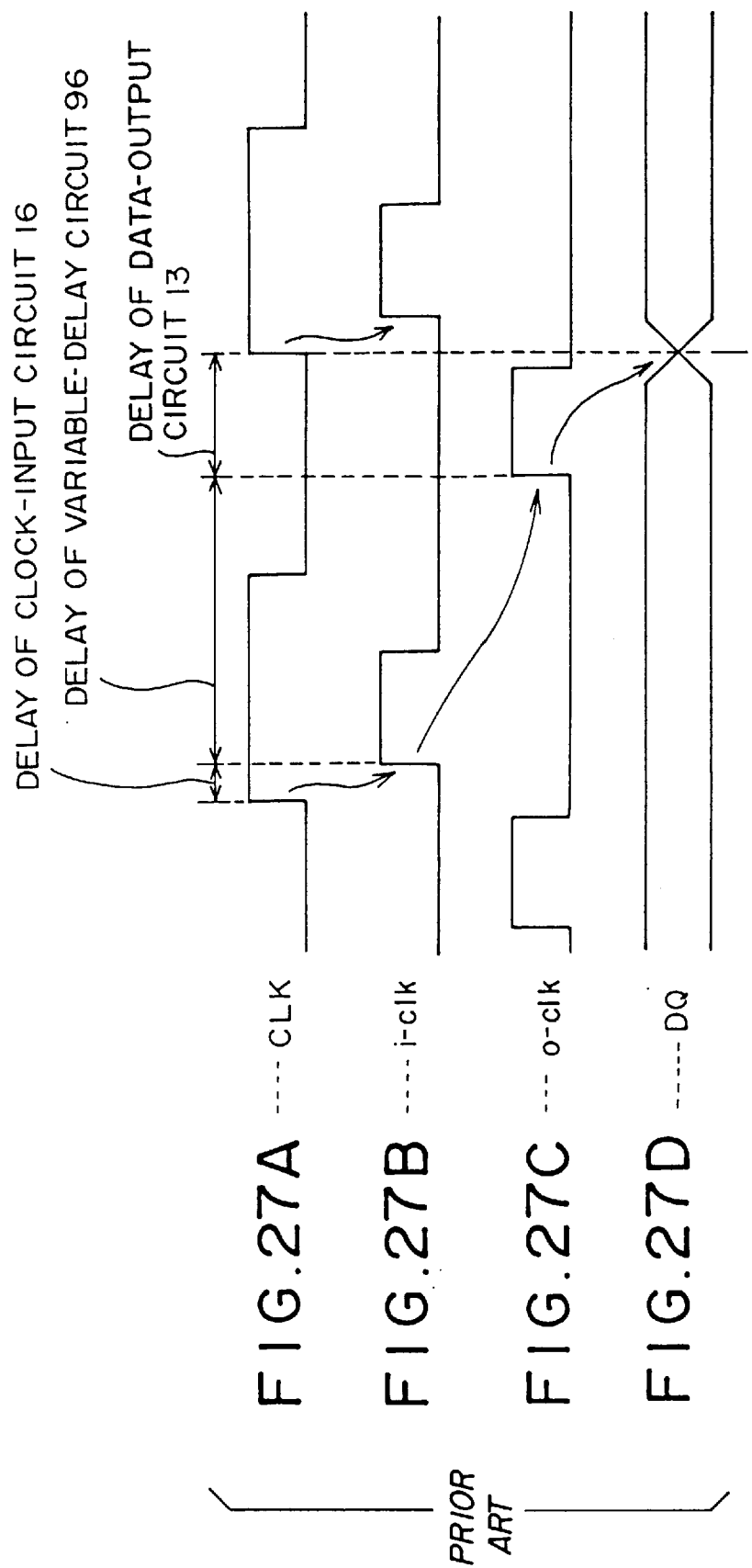
Figure 28:
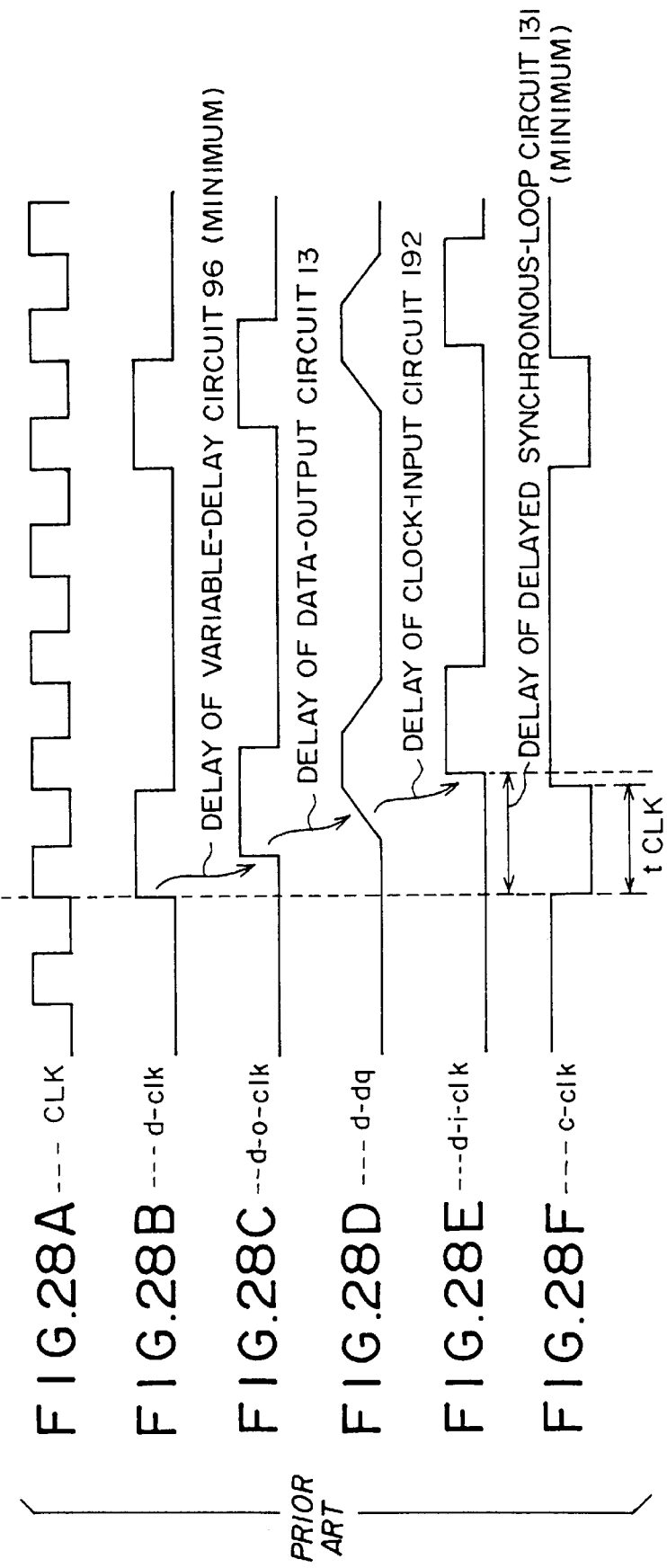
Figure 29:
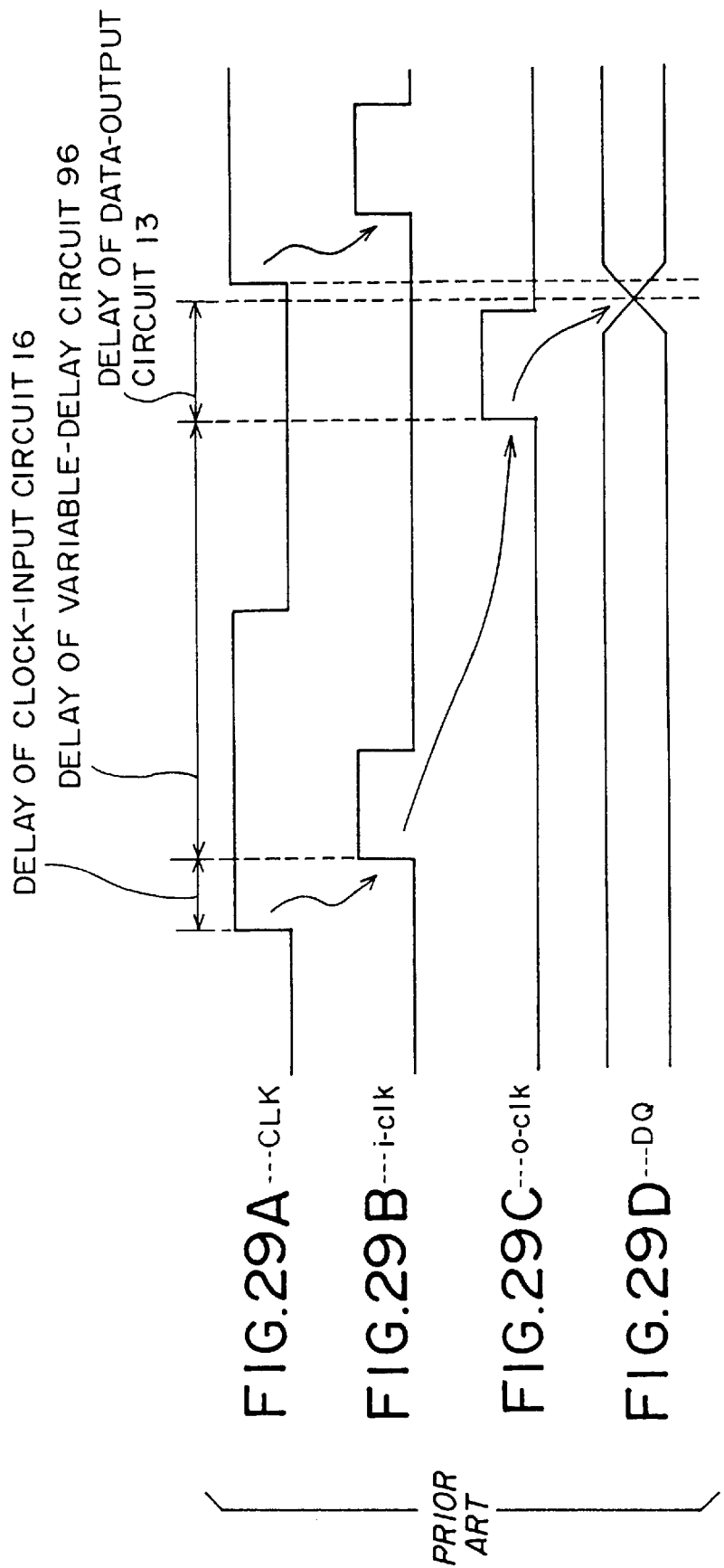
Figure 30:
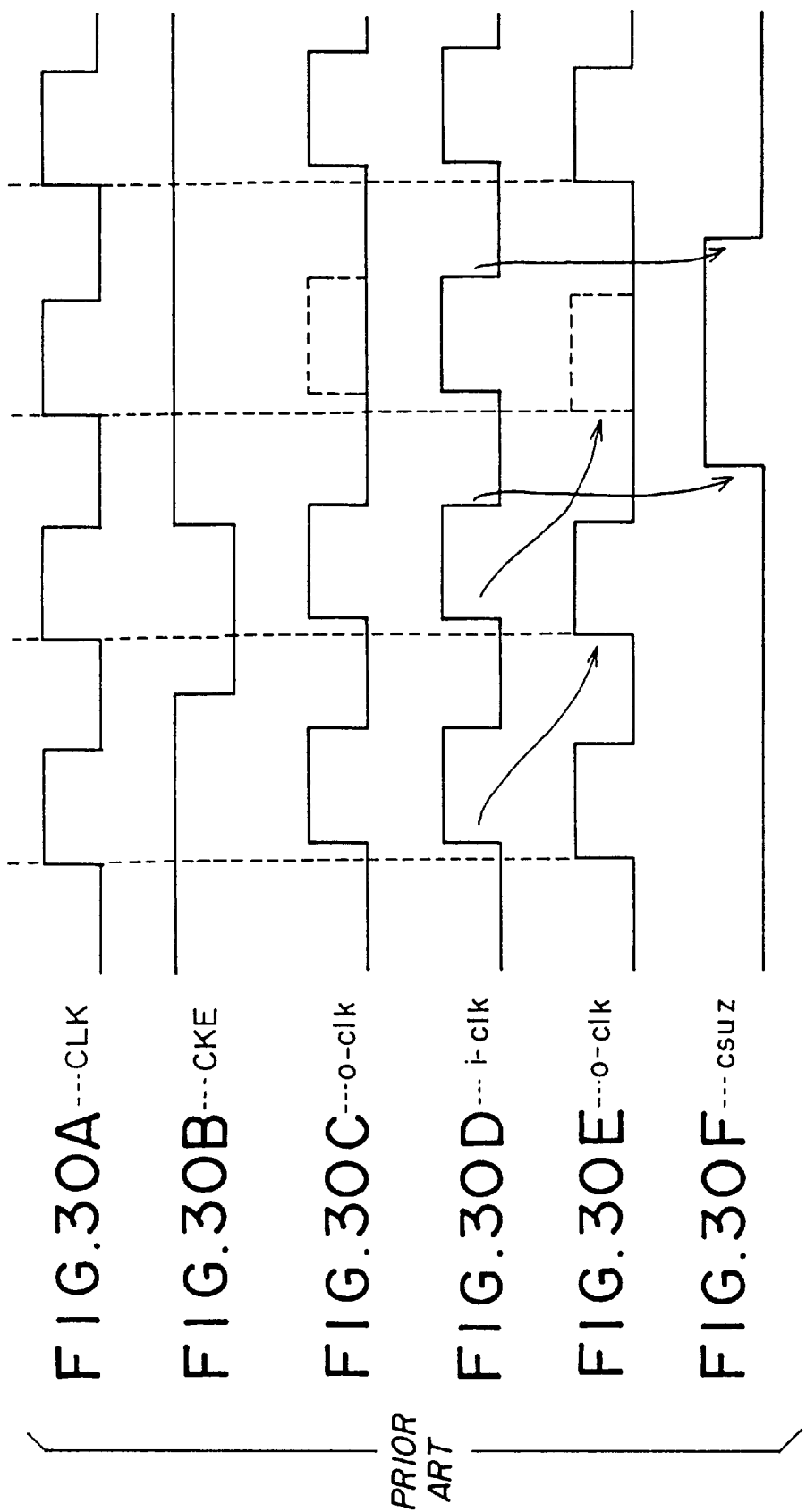
Figure 48:
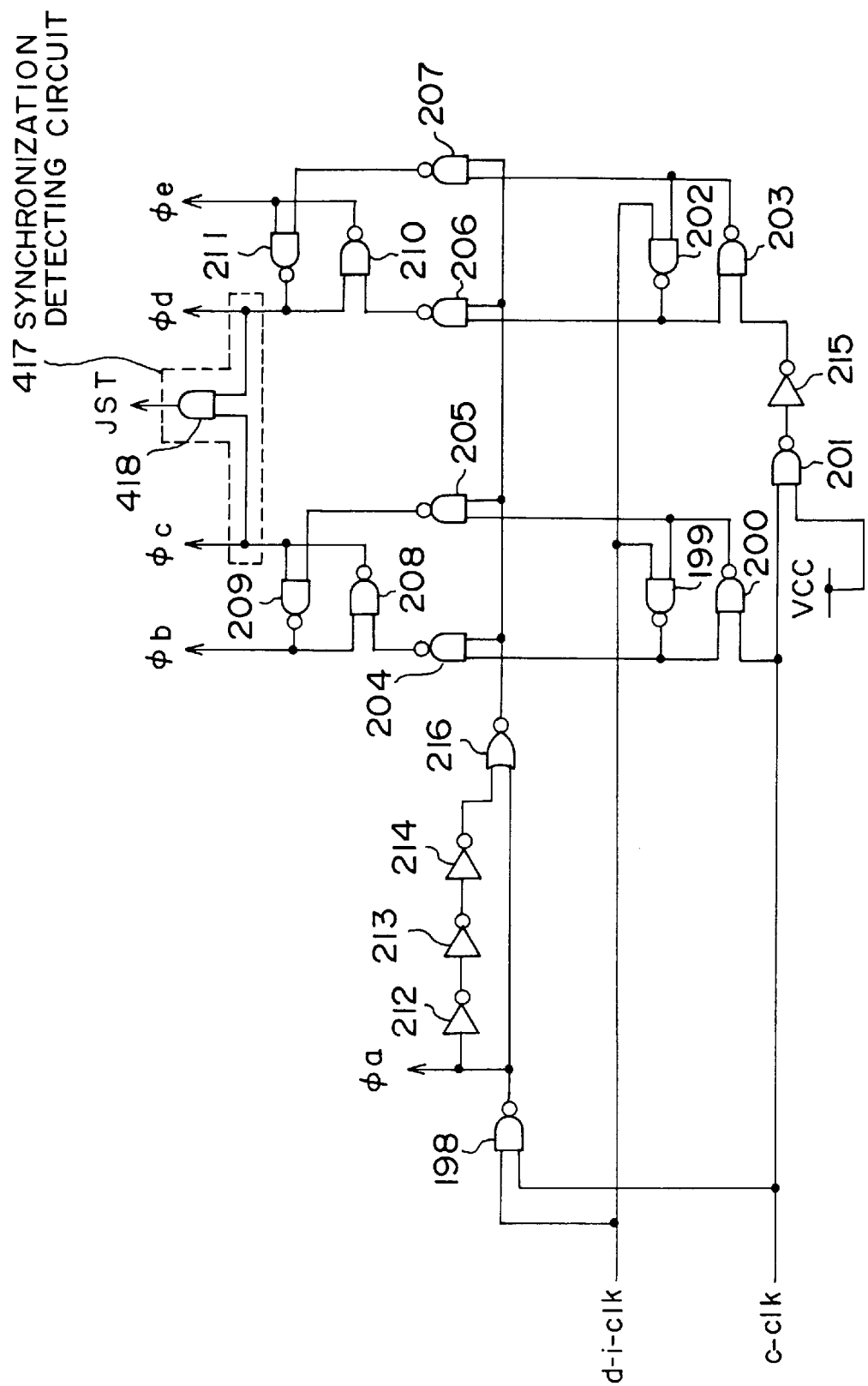
FIG. 48 is a circuit diagram of a phase-comparison part of a phase comparator.

FIG. 48 is a circuit diagram of a phase-comparison part of the phase comparator 415. A delay-control-circuit controlling part of the phase comparator 415 has the same configuration as the delay-control-circuit controlling unit 196 of the phase comparator 193 shown in FIG. 21.

Figure 17:
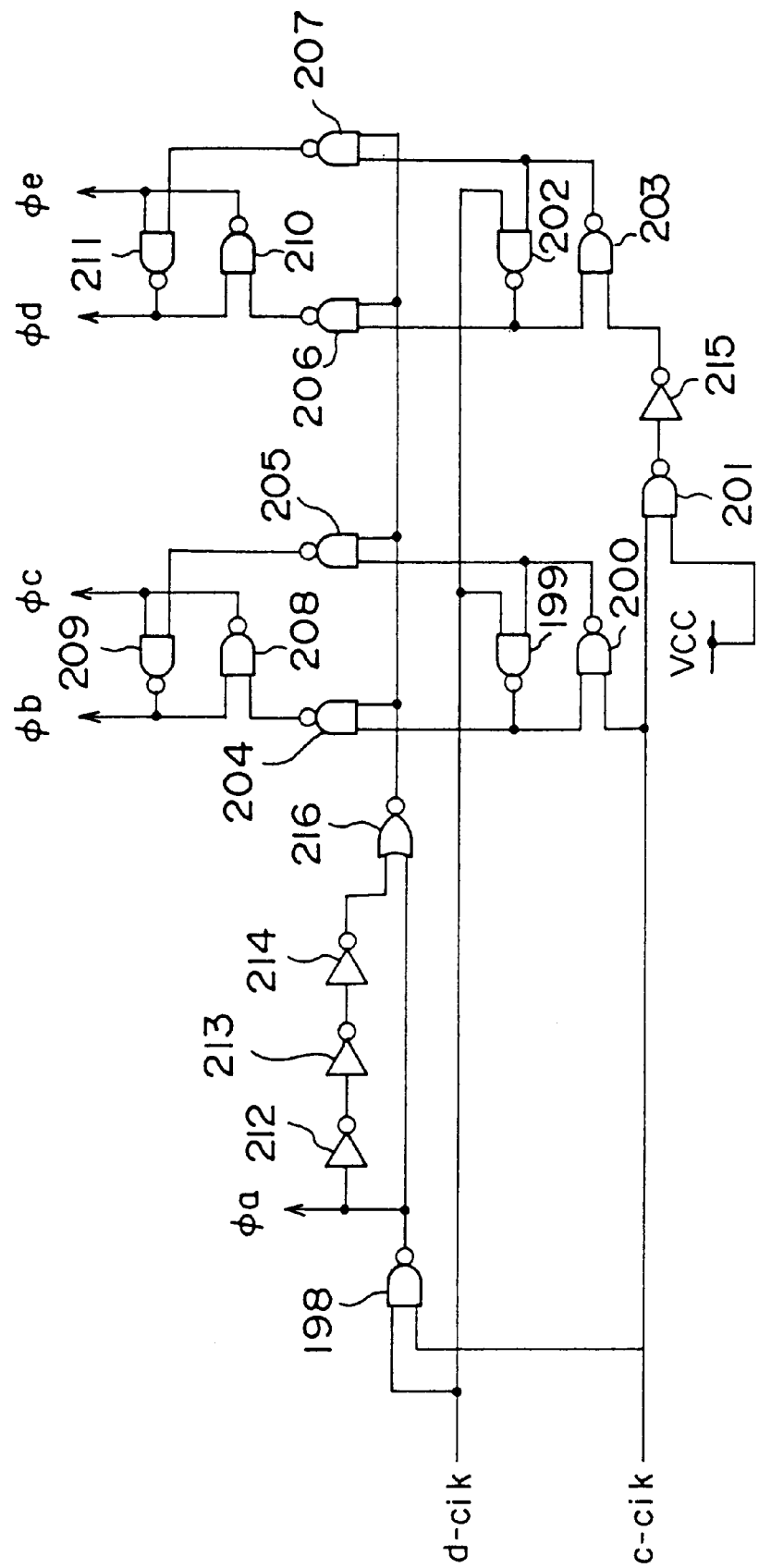
FIG. 17 is a circuit diagram of a phase-comparison unit.

The phase-comparison part of the phase comparator 415 has the same configuration as that of the phase comparator 193 shown in FIG. 17, except that a synchronization detecting circuit 417 is additionally provided to output the synchronization-detection signal JST.

The synchronization detecting circuit 417 includes an AND circuit 418 having one input thereof connected to an output of the NAND circuit 208 and the other input thereof connected to an output of the NAND circuit 211. An output of the NAND circuit 418 is obtained as the synchronization-detection signal JST.

Figure 49:
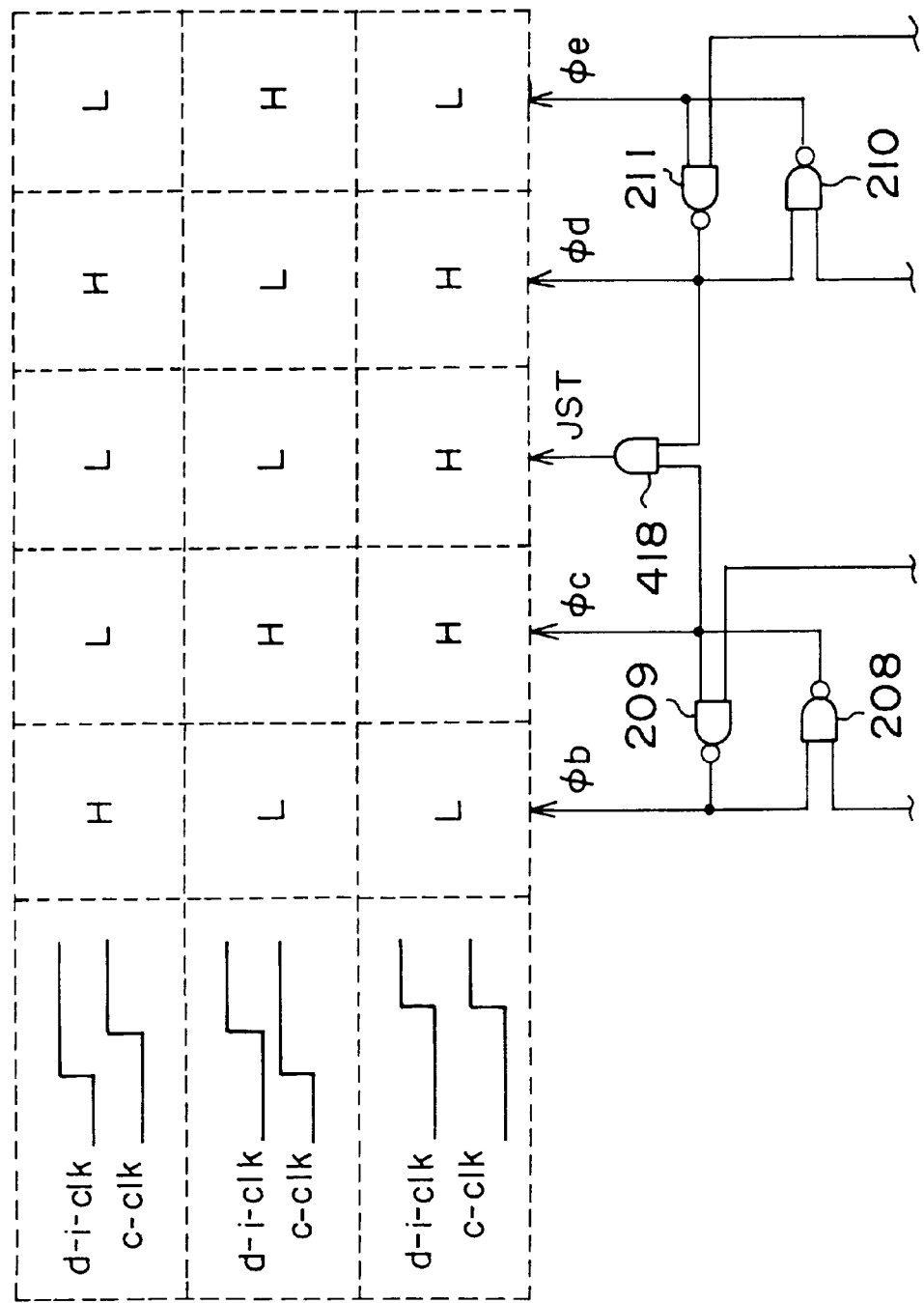
FIG. 49 is an illustrative drawing for explaining a phase-comparison part of the phase comparator.

FIG. 49 is an illustrative drawing for explaining the phase-comparison part of the phase comparator 415. When the phase of the dummy internal clock d-i-clk is ahead of the phase of the reference clock c-clk, for example, the phase-comparison signals $\phi b$, $\phi c$, $\phi d$, and $\phi e$ are HIGH, LOW, HIGH, and LOW, respectively, as can be seen also in FIGS. 18A through 18G. In this case, the synchronization-detection signal JST is LOW.

When the dummy internal clock d-i-clk has a phase that is behind the phase of the reference clock c-clk, the phase-comparison signals $\phi b$, $\phi c$, $\phi d$, and $\phi e$ are LOW, HIGH, LOW, and HIGH, respectively, as can be seen also in FIGS. 20A through 20G. The synchronization-detection signal JST in this case is also LOW.

When the dummy internal clock d-i-clk is in synchronism with the reference clock c-clk, the phase-comparison signals $\phi b$, $\phi c$, $\phi d$, and $\phi e$ are LOW, HIGH, HIGH, and LOW, respectively, as can be also seen in FIGS. 19A through 19G. The synchronization-detection signal JST in this case becomes HIGH.

In this manner, the synchronization-detection signal JST is HIGH when the dummy internal clock d-i-clk is in synchronism with the reference clock c-clk, and is LOW when these two clocks are out of synchronism.

The second embodiment of the present invention not only achieves the same improved results as those of the first embodiment, but also achieves a power-consumption reduction in the DLL circuit 406 by dividing the frequencies of the dummy clock d-clk, the frequency-divided clock a01, and the frequency-divided clock a02 by a one-to-two ratio. This reduction is made when the dummy internal clock d-i-clk is in synchronism with the reference clock c-clk to change the synchronization-detection signal JST to HIGH.

In the first and second embodiments described above, the overflow-detection circuit 357 and the clock-control circuits 358 and 359 are provided. Alternately, the semiconductor integrated circuit of the present invention may operate perfectly well without the overflow-detection circuit 357 and the clock-control circuits 358 and 359.

Further, the present invention is not limited to these embodiments, but various variations and modifications may be made without departing from the scope of the present invention.

What is claimed is:

1. A semiconductor integrated circuit comprising:
    a first clock-input circuit receiving an external clock from an external source and outputting an internal clock;
    an output-control-clock generating circuit receiving said internal clock to generate an output-control clock; and
    a first data-output circuit outputting output data in synchronism with one of a rise timing and a fall timing of said output-control clock,
    wherein said output-control-clock generating circuit controls a timing of said output-control clock such that said first data-output circuit outputs said output data a predetermined fraction of one clock cycle of said external clock after a clock edge of said external clock, said predetermined fraction of one clock cycle of the external clock being in constant ratio to one clock cycle of the external clock regardless of a frequency of the external clock.

2. A semiconductor integrated circuit comprising:
    a first clock-input circuit receiving an external clock from an external source and outputting an internal clock;
    an output-control-clock generating circuit receiving said internal clock to generate an output-control clock; and
    a first data-output circuit outputting output data in synchronism with one of a rise timing and a fall timing of said output-control clock,
    wherein said output-control-clock generating circuit controls a timing of said output-control clock such that said first data-output circuit outputs said output data a predetermined fraction of one clock cycle of said external clock after a clock edge of said external clock,
    wherein said output-control-clock generating circuit comprises
        a first variable-delay circuit delaying said internal clock to output said output-control clock,
        a first frequency divider dividing a frequency of said internal clock to generate a dummy clock and a reference clock, and
        a DLL circuit controlling said first variable-delay circuit based on said dummy clock and said reference clock to delay said internal clock such that said first data-output circuit outputs said output data said predetermined fraction of said one clock cycle after a clock edge of said external clock.

3. The semiconductor integrated circuit as claimed in claim 2, wherein said DLL circuit comprises:
    a second variable-delay circuit delaying said dummy clock by the same delay amount as that of said first variable-delay circuit to generate dummy output-control clock;
    a second data-output circuit receiving said dummy output-control clock and outputting dummy output data, said second data-output circuit emulating said first data-output circuit;
    a second clock-input circuit receiving said dummy output data and outputting dummy internal clock, said second clock-input circuit emulating said first clock-input circuit;
    a phase comparator comparing phases between said reference clock and said dummy internal clock to generate a comparison result;
    a delay-control circuit adjusting a delay of said second variable-delay circuit based on said comparison result such that said reference clock and said dummy internal clock have the same phase.

4. The semiconductor integrated circuit as claimed in claim 3, further comprising a first signal line conveying said output-control clock to said first data-output circuit, wherein said DLL circuit further comprises:
    a second signal line conveying said dummy output-control clock to said second data-output circuit, said second signal line emulating said first signal line; and
    a load circuit receiving said dummy output data from said second data-output circuit and supplying said dummy output data to said second clock-input circuit, said load circuit emulating load which said first data-output circuit incurs.

5. A semiconductor integrated circuit comprising:
    a first clock-input circuit receiving an external clock from an external source and outputting an internal clock;
    an output-control-clock generating circuit receiving said internal clock to generate an output-control clock; and
    a first data-output circuit outputting output data in synchronism with one of a rise timing and a fall timing of said output-control clock,
    wherein said output-control-clock generating circuit controls a timing of said output-control clock such that said first data-output circuit outputs said output data a predetermined fraction of one clock cycle of said external clock after a clock edge of said external clock,
    wherein said output-control-clock generating circuit comprises
        a first variable-delay circuit delaying said internal clock to output a delayed clock, said first variable-delay circuit having a delay limit as to how much said internal clock can be delayed,
        a first clock-control circuit receiving said internal clock and said delayed clock and outputs one of said internal clock and said delayed clock as said output-control clock,
        a first frequency divider dividing a frequency of said internal clock to generate a dummy clock and a reference clock,
        a DLL circuit controlling said first variable-delay circuit based on said dummy clock and said reference clock to delay said internal clock such that said first data-output circuit outputs said output data said predetermined fraction of said one clock cycle after a clock edge of said external clock, and
        a clock-selection-signal supplying circuit supplying a clock-selection signal to said first clock-control circuit so that said first clock-control circuit selects said delayed clock as said output-control clock when a delay of said first variable-delay circuit is within said delay limit, and selects said internal clock as said output-control clock when said delay of said first variable-delay circuit reaches said delay limit.

6. The semiconductor integrated circuit as claimed in claim 5, wherein said first clock-control circuit comprises:
- a first circuit allowing said internal clock to pass therethrough when said clock-selection signal is a first level;
- a second circuit allowing said delayed clock to pass therethrough when said clock-selection signal is a second level; and
- a third circuit allowing either one of said internal clock from said first circuit and said delayed clock from said second circuit to pass therethrough to output said output-control clock.

7. The semiconductor integrated circuit as claimed in claim 5, wherein said DLL circuit comprises:
- a second variable-delay circuit delaying said dummy clock by the same delay amount as that of said first variable-delay circuit to generate delayed dummy clock;
- a second clock-control circuit receiving said delayed dummy clock and outputting dummy output-control clock, said second clock-control circuit emulating said first clock-control circuit;
- a second data-output circuit receiving said dummy output-control clock and outputting dummy output data, said second data-output circuit emulating said first data-output circuit;
- a second clock-input circuit receiving said dummy output data and outputting a dummy internal clock, said second clock-input circuit emulating said first clock-input circuit;
- a phase comparator comparing phases between said reference clock and said dummy internal clock to generate a comparison result;
- a delay-control circuit adjusting a delay of said second variable-delay circuit based on said comparison result such that said reference clock and said dummy internal clock have identical phases.

8. The semiconductor integrated circuit as claimed in claim 7, further comprising a first signal line conveying said output-control clock to said first data-output circuit, wherein said DLL circuit further comprises:
- a second signal line conveying said dummy output-control clock to said second data-output circuit, said second signal line emulating said first signal line; and
- a load circuit receiving said dummy output data from said second data-output circuit and supplying said dummy output data to said second clock-input circuit, said load circuit emulating load which said first data-output circuit incurs.

9. The semiconductor integrated circuit as claimed in claim 7, wherein said reference clock is delayed behind said dummy clock by said one clock cycle plus said predetermined fraction of said one clock cycle.

10. The semiconductor integrated circuit as claimed in claim 9, wherein said first frequency divider comprises:
- a second frequency divider generating said dummy clock, a first frequency-divided clock for indicating a timing which is delayed behind an edge timing of said dummy clock by said one clock cycle, and a second frequency-divided clock for indicating a timing which is delayed behind said timing of said first frequency-divided clock by said one clock cycle;
- a series of variable-delay circuits delaying said first frequency divided clock, said variable-delay circuits having an adjustable delay identical to each other, a last one of said variable-delay circuits in said series outputting a third frequency-divided clock;
- a phase comparator comparing phases between said second frequency-divided clock and said third frequency-divided clock to output a comparison result; and
- a delay-control circuit controlling said adjustable delay according to the comparison result from said phase comparator such that said second frequency-divided clock and said third frequency-divided clock are in synchronism with each other, wherein said reference clock comprises an output of one of said variable-delay circuits.

11. The semiconductor integrated circuit as claimed in claim 7, wherein said first frequency divider lowers frequencies of said dummy clock and said reference clock when said phase comparator finds that said reference clock and said dummy internal clock have identical phases.

12. The semiconductor integrated circuit as claimed in claim 11, wherein said phase comparator comprises a circuit for detecting a synchronism between said reference clock and said dummy internal clock and for outputting a synchronization-detection signal to said first frequency divider.

13. A semiconductor integrated circuit comprising:
- a first clock-input circuit receiving an external clock from an external source and outputting an internal clock;
- an output-control-clock generating circuit receiving said internal clock to generate an output-control clock; and
- a first data-output circuit outputting output data in synchronism with one of a rise timing and a fall timing of said output-control clock, wherein said output-control-clock generating circuit controls a timing of said output-control clock such that said first data-output circuit outputs said output data a predetermined fraction of one clock cycle of said external clock after a clock edge of said external clock, said semiconductor integrated circuit further comprising
- a clock-enable-signal-input circuit receiving a clock-enable signal from an external source, a clock-enable-signal-input circuit supplying a clock-suspend signal to said first clock-input circuit to stop said first clock-input circuit from outputting said internal clock when said clock-enable signal is active, wherein said first clock-enable-signal-input circuit operates asynchronously in supplying said clock-suspend signal to said first clock-input circuit.

14. The semiconductor integrated circuit as claimed in claim 13, wherein said first clock-input circuit comprises:
- a differential amplifier receiving said external clock and outputting said internal clock; and
- a gate circuit allowing said internal clock to pass therethrough when said clock-suspend signal is inactive.

* * * * *